United States Patent [19]
Husain et al.

[11] Patent Number: 5,548,470
[45] Date of Patent: Aug. 20, 1996

[54] CHARACTERIZATION, MODELING, AND DESIGN OF AN ELECTROSTATIC CHUCK WITH IMPROVED WAFER TEMPERATURE UNIFORMITY

[75] Inventors: Anwar Husain, Pleasanton, Calif.; David E. Kotecki, Hopewell Junction; Stephan E. Lassig, Poughkeepsie, both of N.Y.; Kurt A. Olson, Sebastopol, Calif.; Anthony J. Ricci, Hopewell Junction, N.Y.

[73] Assignee: International Business Machines Corporation, Armonk, N.Y.

[21] Appl. No.: 277,552

[22] Filed: Jul. 19, 1994

[51] Int. Cl.$^6$ .................................................. H02N 13/00
[52] U.S. Cl. ................................................................ 361/234
[58] Field of Search ............................... 361/234; 279/128

[56] References Cited

U.S. PATENT DOCUMENTS

| | | | |
|---|---|---|---|
| 4,261,762 | 4/1981 | King . | |
| 4,656,601 | 1/1986 | Kakehi et al. | 156/643 |
| 4,680,061 | 7/1987 | Lamont, Jr. . | |
| 4,931,135 | 6/1990 | Horiuchi et al. | 156/643 |
| 5,055,964 | 10/1991 | Logan et al. | 361/234 |
| 5,155,652 | 10/1992 | Logan et al. | 361/234 |
| 5,160,152 | 11/1992 | Toraguchi et al. | 361/234 X |
| 5,184,398 | 2/1993 | Moslehi . | |
| 5,213,349 | 5/1993 | Elliott . | |
| 5,270,266 | 12/1993 | Hirano et al. | 437/228 |
| 5,315,473 | 5/1994 | Collins et al. | 361/234 |
| 5,320,982 | 6/1994 | Tsubone et al. | 437/228 |
| 5,345,999 | 9/1994 | Hosokawa | 165/80.2 |
| 5,350,479 | 9/1994 | Collins et al. | 156/345 |
| 5,384,682 | 1/1995 | Watanabe et al. | 361/234 |
| 5,413,360 | 5/1995 | Atari et al. | 361/234 X |

FOREIGN PATENT DOCUMENTS

| | | |
|---|---|---|
| 357424 | 3/1990 | European Pat. Off. . |
| 0452222 | 10/1991 | European Pat. Off. . |
| 473930 | 3/1992 | European Pat. Off. . |
| 1-251735 | 10/1989 | Japan . |

OTHER PUBLICATIONS

European Search Report of EP 95 48 0079.
"Electrostatic Wafer Chuck for Electron Beam Microfabrication"; George A. Wardly; 1973; IBM Thomas J. Watson Research Center; pp. 1506–1509.
Daviet et al., Electrostatic Clamping applied to Semiconductor Plasma Processing II Experimental Results J. Electrochem. Soc. vol. 140, No. 11, Nov. 1993, pp. 3256–3261.
IBM Technical Disclosure Bulletin, vol. 31, No. 1, Jun. 1988, Electrostatic Wafer Holder for Wafer Cooling During Reactive Ion Etching, pp. 462–464.

*Primary Examiner*—Fritz M. Fleming
*Attorney, Agent, or Firm*—Whitham, Curtis, Whitham & McGinn; Eric W. Petraske

[57] ABSTRACT

An electrostatic chuck (ESC) provides increased temperature uniformity and adjustment capability of the surface of a wafer or wafer-like workpiece during processing, for example, in an electron-cyclotron-resonance chemical vapor deposition (ECR-CVD) reactor. Temperature uniformity is achieved through an improved pattern of grooves in the face of the ESC which allows an inert gas to be contained between the ESC and a wafer held thereby even at high levels of vacuum. The ESC is adapted for a particular desired temperature range by choice of surface roughness of the remaining areas of the face of the ESC. Adjustability within that range is achieved by variation of the electrostatic voltage by which a wafer is held against the chuck face.

21 Claims, 12 Drawing Sheets

CHARACTERIZATION, MODELING, AND DESIGN OF AN ELECTROSTATIC CHUCK WITH IMPROVED WAFER TEMPERATURE UNIFORMITY

FIELD OF THE INVENTION

The present invention generally relates to electrostatic chucks (ESCs) as may be used to hold a semiconductor wafer during processing, for example, in an electron-cyclotron-resonance chemical vapor deposition (ECR-CVD) reactor used to deposit high quality films of silicon dioxide ($SiO_2$) and, more particularly, to arrangements for controlling heat transfer from the semiconductor wafer to the ESC and improving temperature uniformity of the wafer during such processing.

BACKGROUND OF THE INVENTION

There has been a continual trend in microelectronics manufacturing towards single-wafer processing for a variety of semiconductor fabrication steps. One requirement inherent in the design of single-wafer reactors is the need to unobtrusively secure the wafer during processing, while at the same time controlling the temperature of the wafer and temperature uniformity across the surface of the wafer. The ability to control the temperature, and temperature uniformity, of a silicon wafer is of great importance in a wide variety of semiconductor processing techniques since the processing generally involves metallurgical or chemical reactions which may be significantly affected by the temperature of the surface on which the processing is carried out.

Mechanical wafer clamps which engage a portion of the wafer front surfaces where processing is to be performed can create process uniformity problems by interfering with flow of gas, altering the plasma distribution, and acting as a heat sink. If improperly designed, mechanical wafer clamps can also cause the formation of particulates with consequent contamination of the wafer and contribute to bowing of the wafer with consequent complications of focus and registration for lithographic processes as well as planarization processes.

An electrostatic chuck (ESC), which uses an electrostatic potential to hold a wafer in place during processing, can avoid the problems of heat sinking and interference with gas flow at the front surface of the wafer by providing contact with only the back side of the wafer. Therefore, use of an electrostatic clamp is an attractive alternative to front side mechanical clamps. Consequently, in recent years, there has been a considerable interest in use of an electrostatic chuck which, in addition to the above advantages, can also reduce the tendency of bowing and contamination of the front side of the wafer over mechanical clamps or gravitational wafer placement (see, for example, G. A. Wardly, Rev. Sci. Instrum., 44, 1506 (1973)).

However, electrostatic chucks also constitute heat sinks at the back side of the wafer and, although to a lesser degree than mechanical chucks, have contributed to a lack of temperature uniformity of the wafer. To ensure homogeneous film processing over the entire area of the wafer, a substantially uniform wafer temperature must be produced and maintained at the wafer surface. The rate of film deposition, the physical, electrical, and optical properties, and the composition of the deposited material can all be affected by the temperature of the wafer during the deposition process. Likewise, the rate of etch, the selectivity of etch and anisotropy of etch can be affected by the temperature of the wafer during plasma etching.

The control of heat transfer between the wafer and wafer holder or chuck, regardless of type, is particularly complex in plasma systems which operate at low pressure and have an RF bias applied to the wafer. Thermal energy is transferred to the wafer surface through ion bombardment, and the chuck is ideally required to remove large amounts of heat from the wafer while maintaining a stable and uniform temperature at the wafer surface. In these systems, as exemplified by U.S. Pat. Nos. 4,261,762 and 4,680,061, a gas (usually He) is employed between the wafer and the chuck to control the removal of heat from the wafer. Since many semiconductor processing operations are carried out at extremely low pressures, the pressure of gas between the wafer and the chuck must often be at a greater pressure in order to provide an adequate degree of heat transfer. This greater pressure, of course, tends to separate the wafer from the chuck. Consequently, some type of wafer clamping (e.g., mechanical or electrostatic) is required.

During many types of semiconductor processing and plasma processes, in particular, it is found that the wafer temperature is significantly higher than the chuck temperature and that control of thermal resistances across the wafer/ESC interface is critical in controlling wafer temperature uniformity. More specifically, the thermal conduction within a semiconductor wafer (e.g., across its thickness) and within the body of a wafer chuck are generally well behaved and predictable. However, the interface between the semiconductor wafer and chucks of both the mechanical clamping type and the electrostatic type has appeared to be highly unpredictable as well as imposing a substantial degree of complexity on the numerous heat transfer mechanisms involved. For example, since it is common practice to circulate an inert gas, such as helium, as referred to above, through circumferential grooves in the face of the chuck, heat transfer coefficients for both the gas and the chuck surface must be considered. These heat transfer coefficients are markedly different and each can also vary widely. Additionally, the relative contributions of heat transfer across the interface also vary with local and overall contact fractions between the wafer and chuck surface.

The design of the pattern of grooves formed in the face of a chuck has heretofore been based principally on the achievement of a particular contact ratio with a radially symmetrical pattern. Difficulty of measurement of temperature at small areas of the surface of a wafer has largely prevented refinement of designs. However, significant variations of processing have been detected between different locations on a processed wafer, inferring that temperature uniformity across the wafer face is not adequately maintained during semiconductor processing when held by any currently known type of chuck. Further, no convenient mechanism known for exercising temperature control or improving temperature uniformity has been available.

SUMMARY OF THE INVENTION

It is therefore an object of the present invention to provide an electrostatic chuck which provides increased temperature uniformity at the wafer surface.

It is another object of the invention to provide an electrostatic chuck which allows control of wafer temperature over a substantial range during semiconductor processing.

It is a further object of the invention to provide a plurality of electrostatic chuck surface designs which are optimized for particular wafer temperature ranges.

It is yet another object of the invention to provide an electrostatic chuck which allows independent coarse and fine control of wafer surface temperature while maintaining substantial uniformity of wafer surface temperature across the wafer surface.

In accordance with the invention, the temperature range within which a wafer is to be maintained is determined by providing a particular degree of surface roughness of the face of the ESC. The overall temperature of the wafer can be strongly adjusted by varying the value of the ESC clamping voltage ($V_{ESC}$) and the temperature fine tuned by adjusting the value of the pressure of the gas (usually He) between the wafer and the chuck ($P_{He}$). The temperature distribution across the wafer surface, for a given value of the heat transfer coefficients $h_c$ (due to the physical contact between the silicon wafer and the ESC) and $h_g$ (due to the presence of the He gas), is determined by the surface pattern on the ESC and a novel chuck surface pattern yielding a high degree of temperature uniformity is provided.

In order to achieve the foregoing and other objects of the invention, therefore, an electrostatic chuck for holding a semiconductor wafer during processing is provided comprising a dielectric layer on a front face of the electrostatic chuck for contacting the wafer, the dielectric layer having a nominal surface roughness and a pattern of grooves formed therein to a depth which is short relative to the mean free path of a gas which may be disposed therein at a static pressure, the pattern of grooves having a central portion having a substantially constant nominal contact area fraction or an effective contact area fraction which is determined in accordance with a profile of plasma density across a wafer surface and an outer, annular region having another nominal contact area fraction being greater than the constant nominal contact area fraction, a cooling plate in thermal communication with the dielectric layer for removing heat from said electrostatic chuck, and an electrode for developing an electrostatic attraction force of the wafer against the front face of said electrostatic chuck.

In accordance with another aspect of the invention, an electrostatic chuck system is provided for holding a wafer-like workpiece by electrostatic attraction and comprising a dielectric layer supporting the workpiece and having a top surface in mechanical contact with the workpiece and having a set of gas distribution grooves therein with a nominal groove depth which is small in comparison with a mean free path of a molecule of gas contained therein and an annular rim at an outer periphery thereof; gas supply means, connected to the gas distribution grooves, for maintaining a gas pressure in the gas distribution grooves; an electrode, disposed below the dielectric layer and connected to voltage supply means for applying a voltage to said electrode and said workpiece, wherein the set of gas distribution grooves forms a set of contact pads having a common contact surface within the annular rim and the gas pressure is such that a gas has a mean free path large compared with the nominal groove depth; the dielectric layer having a surface roughness determined in accordance with an intended wafer temperature during processing.

In accordance with a further aspect of the invention, a method of processing a semiconductor wafer is provided comprising the steps of: attaching a semiconductor wafer to an electrostatic chuck having a nominal contact area fraction between gas confining grooves on a surface thereof and nominal surface roughness, the nominal contact area fraction being determined in accordance with a desired nominal temperature of the semiconductor wafer, making an adjustment of temperature of said semiconductor wafer by adjustment of electrostatic clamping voltage, and making an adjustment of temperature of the semiconductor wafer by adjustment of gas pressure in the grooves.

BRIEF DESCRIPTION OF THE DRAWINGS

The foregoing and other objects, aspects and advantages will be better understood from the following detailed description of a preferred embodiment of the invention with reference to the drawings, in which:

FIG. 2b is the enlarged and detailed showing of the circled portion of FIG. 2a;

DETAILED DESCRIPTION OF A PREFERRED EMBODIMENT OF THE INVENTION

In the following discussion of the invention, references will be made to simulations of ESC performance and experimental verification thereof. The simulations and experiments were conducted assuming or using an electron-cyclotron-resonance chemical vapor deposition (ECR-CVD) reactor (using an electrostatic chuck, provided by Lam Research Corporation—see S. H. Lassig and J. D. Tucker, "Intermetal Dielectric Deposition by ECR CVD," Lam Research technical report #TL-019, 1993) since the power incident on the wafer during such a process and the resulting temperature variations at the wafer surface will be among the largest encountered in most semiconductor processing operations. Films of high quality $SiO_2$ were deposited on 200 mm diameter, double-sided, polished, Si wafers described previously by Lassig et al. (S. H. Lassig, K. A. Olson, and W. Patrick, Proceedings from the IEEE VLSI Multilevel Interconnect Conference, 122 (1993)). The ESC consisted of a ceramic ($Al_2O_3$) body with an embedded tungsten electrode. The electrostatic characteristics of this chuck have been described previously by Watanabe (see Watanabe, T. Kitabayashi, and C. Nakayama, Japan J. Appl. Phys., 33, 2145 (1992)). However, it is to be understood that the principles of the invention can be applied to other processes and semiconductor processing apparatus.

Figure 1:
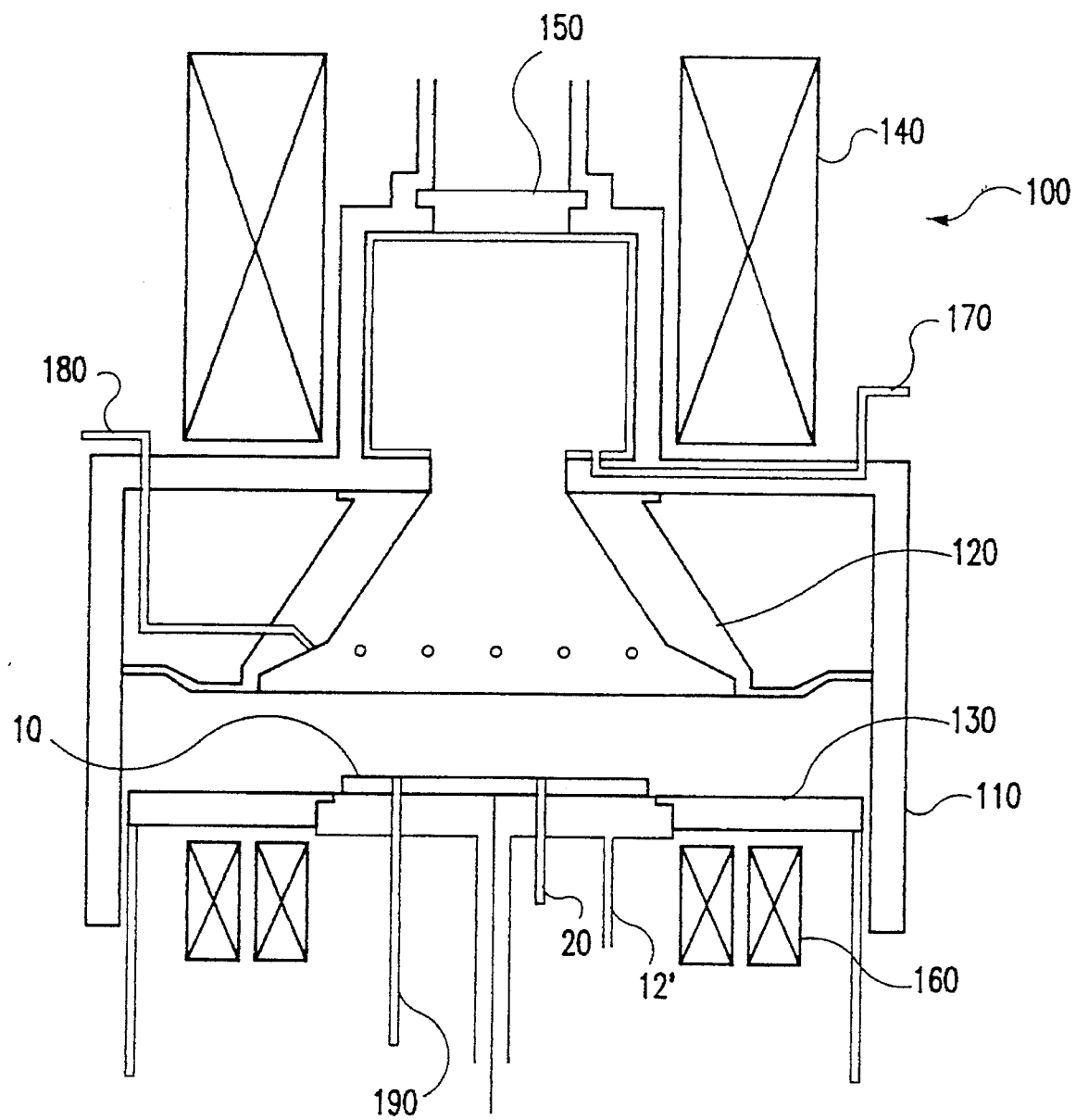
FIG. 1 is a cross-sectional view of the reactor in relation to the position of the ESC and wafer.

An exemplary form of a reactor in which an ECR-CVD process may be carried out is illustrated in cross-section in FIG. 1. It is to be understood that no admission is made that any portion on FIG. 1 is prior art as to the present invention, particularly since, at the level of detail contained in FIG. 1, the depiction of the electrostatic chuck could represent either a known electrostatic chuck or an electrostatic chuck in accordance with the invention. It is also to be understood that an electrostatic chuck in accordance with the invention will produce the effects of permitting both coarse and fine temperature adjustment and provide increased temperature uniformity across the surface of the wafer regardless of the process being performed or the details of any reactor which is appropriate to that process.

As shown in FIG. 1, reactor 100 principally comprises a housing 110, 130 capable of withstanding a deep vacuum surrounded by coils for regulating magnetic fields within the housing and other devices for controlling conditions within the housing such as the reactant materials and the energy supplied thereto. Specifically, the housing is preferably separable into upper and lower parts (110 and 130, respectively) for facilitating the positioning of a wafer on the electrostatic chuck 10 located at an upper surface of the lower portion 130. The remainder of the upper surface of the lower housing portion 130 is preferably water cooled in a manner which is well understood in the art and not critical to the practice of the invention.

Upper housing portion 110 includes a funnel-shaped water-cooled portion 120 which determines the geometry of the upper surface of the reaction chamber formed between upper and lower housing portions 110, 130. The geometry of this surface is also not critical to the practice of the invention; simply serving to confine reactants near the wafer surface. Centrally located above surface 120 is a plasma chamber in which high levels of energy will be imparted to the low pressure gases in the reaction chamber which will cause them to ionize. The is preferably accomplished by supplying microwave energy through a window 150. The dynamics of the plasma so generated are controlled by a magnetic field generated by passing a current through coil 140 surrounding the plasma chamber. In a manner well understood in the art and not critical to the practice of the invention, this field serves to contain the plasma to limit electron and ion flux to the walls of the plasma chamber and to limit material deposition thereon. In a similar manner, magnetic fields generated by mirror and cusp coils 160 serve to direct ions to the vicinity of the electrostatic chuck 10 where a wafer will be located during processing. Reactant materials are introduced into the reactor at appropriate locations by passages 170 and 180. Temperature of the wafer is preferably monitored by a temperature probe 190, preferably located at approximately the center of a radius of the chuck 10. Electrostatic (e.g. DC) and RF bias, coolant gas and liquid coolant for the chuck are also supplied from the back of the lower housing portion 130 as will be discussed in greater detail with reference to FIGS. 2a, 2b and 2c.

Figure 2A:
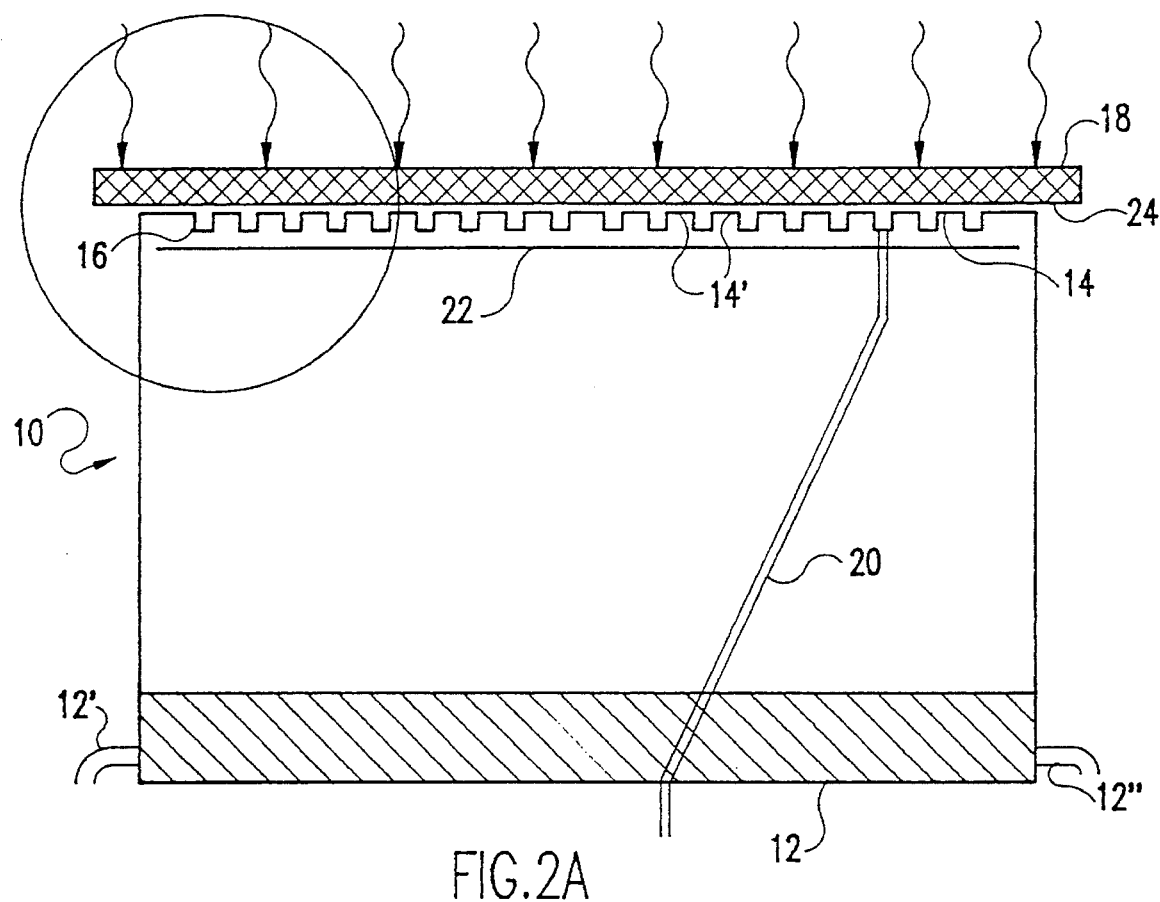
FIG. 2a is the geometry of an electrostatic chuck with a wafer, along with the process conditions which effect the wafer temperature.
Figure 2B:
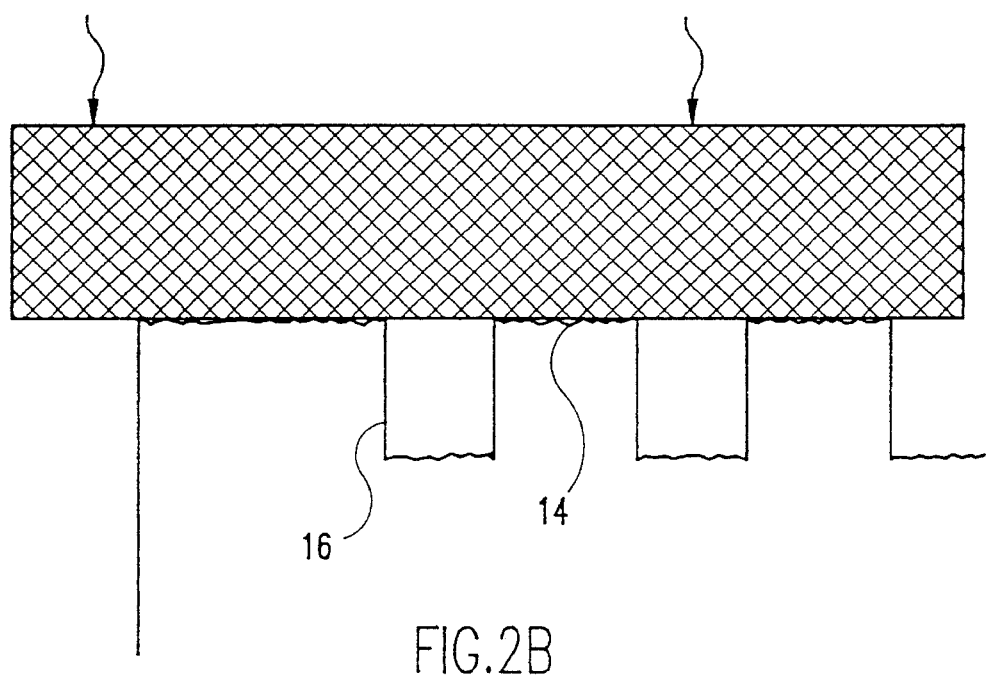
Figure 2C:
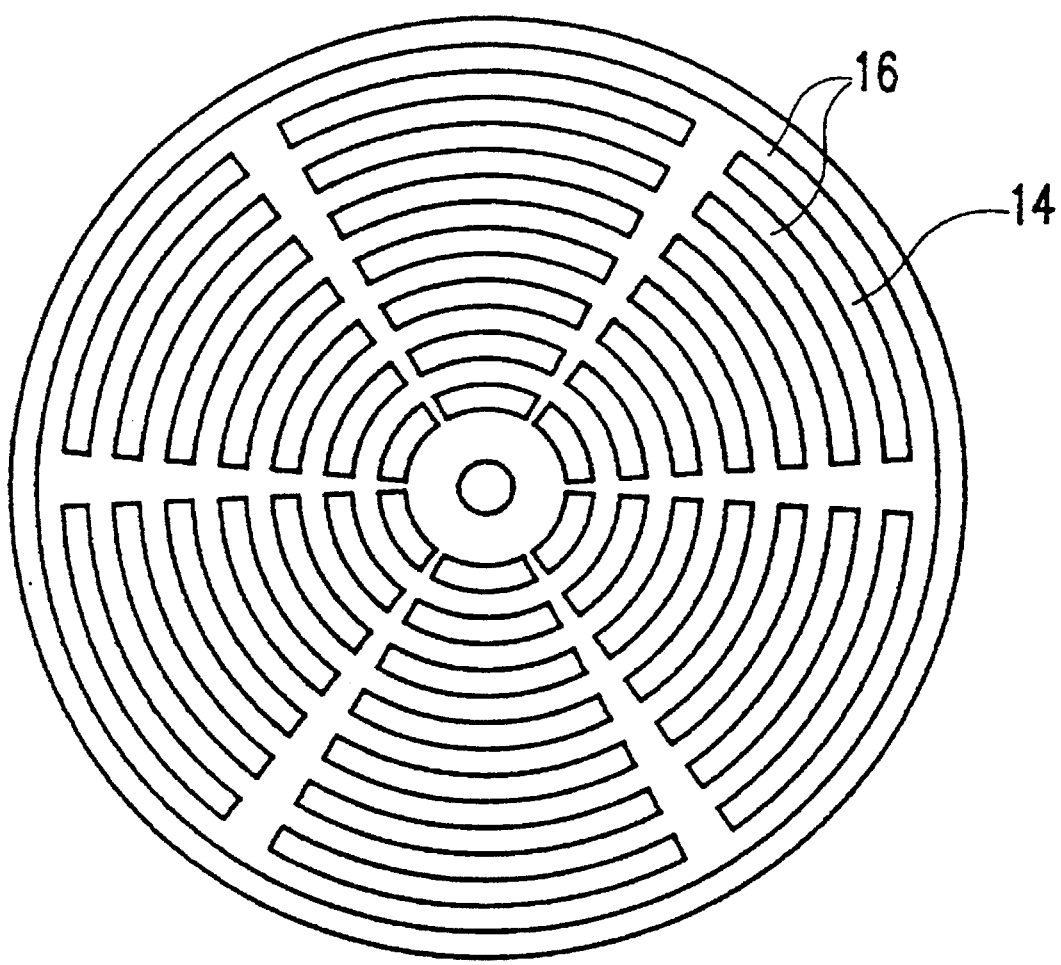
FIG. 2c is a plan view of a chuck surface pattern over which the present invention provides a marked improvement in performance.

The geometry of the electrostatic chuck with a wafer is depicted in greater detail in FIGS. 2a, 2b and 2c. It is to be understood that the invention does not rely on the details of the internal structure of the electrostatic chuck and no admission is made that any portion of FIGS. 2a–2c is prior art in regard to the present invention. The depictions in FIGS. 2a–2c are not to scale and are intended to provide enhanced clarity in the discussion of the operation of electrostatic chucks, in general, as well as the problems of temperature uniformity and control previously encountered in using electrostatic chucks.

As particularly shown in FIG. 2a, the electrostatic chuck 10 includes a cooling plate 12, preferably of copper (although other materials of good thermal conductivity can be used), located at the rear thereof or at least a convenient distance from the front surface 14 of the ESC. Cooling plate 12 preferably includes a manifold or channel in which water or other cooling liquid may be circulated, as indicated by coolant inlet 12' and outlet 12". The water-cooled plate is preferably maintained at 70° C. but this temperature may be varied in dependence on the requirements of heat removal in a particular process. Further structure may be employed as desired behind the cooling plate 12 for immobilization or manipulation of the chuck or for other purposes without affecting the operation of the heat transfer structures near the front surface 14 of the ESC.

The front surface 14 of the ESC is preferably formed of a dielectric layer provided with grooves 16 (which may be in fluid communication with each other as shown in FIG. 2c) for the circulation of a gas in contact with the back side of the wafer 18 at a relatively static pressure when wafer 18 is in contact with front surface 14 of ESC 10. The gas is provided to grooves 16 through one or more passages 20. It should be noted that gas provided in grooves 16 is often at higher pressure than the pressure at which a semiconductor process is carried out in the reactor chamber and some leakage of gas will usually occur, requiring some flow of gas to maintain a static pressure. This flow may also contribute to heat transfer from the wafer and the chuck but will generally be small. If leakage is sufficient for the gas flow rate intended, no outlet for the gas need be provided. However, one or more further passages 20 could be provided as outlets in order to support the gas flow rate desired.

To develop an electrostatic attraction between the chuck 10 and wafer 18, an electrode, preferably formed from tungsten (for heat tolerance and thermal expansion characteristics) is provided as closely as possible to surface 14 below the bottoms of grooves 16. In theory, electrode 22 could be provided at a shallower depth and grooves 16 cut therethrough to form a mesh-like pattern. However, such a structure requires electrical continuity to all portions of the mesh (which may complicate the groove and gas flow pattern) while reducing the area of the electrode and, in accordance with a reduced contact surface ratio following the principles of the invention, would cause a greater reduction in attractive force applied to the wafer than increasing the electrode depth to a location below the grooves 16. Further, placement of the electrode at a shallower depth than the groove depth could cause exposure of the tungsten during chamber cleaning and provide a mechanism for damage to the ESC. As an alternative method of construction of the ESC in accordance with the invention, should a shallower electrode location be desired, a thick electrode of tungsten or aluminum could be provided and grooves in accordance with the invention cut directly in the face of the electrode to a depth less than the electrode thickness. Then the entire face surface of the ESC could be covered with a protective insulating coating layer such as aluminum oxide. This alternative method of formation of the ESC prevents any inadvertent exposure of metal within the reactor.

A uniform electrostatic potential is applied between the wafer and the ESC by applying a DC bias along with any radio frequency bias required by a particular semiconductor wafer processing operation to the tungsten electrode 22 to produce an attractive force between the wafer and the chuck. A reduction in the electrostatic potential and attractive force occurs near the edge of the wafer in the overhang region 24. In practice, the diameter of an ESC should be slightly less than the wafer diameter in CVD applications, in order to shield the ESC surface from the deposition process. )

The magnitude of the electrostatically developed attractive force is not critical to the practice of the invention, although temperature control is achieved in accordance therewith, as will be discussed below. However, the attractive force must be sufficient to immobilize the wafer 18 against surface 14 of ESC 10 even when static pressure in grooves 16 is significantly higher than the ambient semiconductor process pressure in whatever semiconductor processing apparatus is employed for a particular processing operation.

Figure 10:
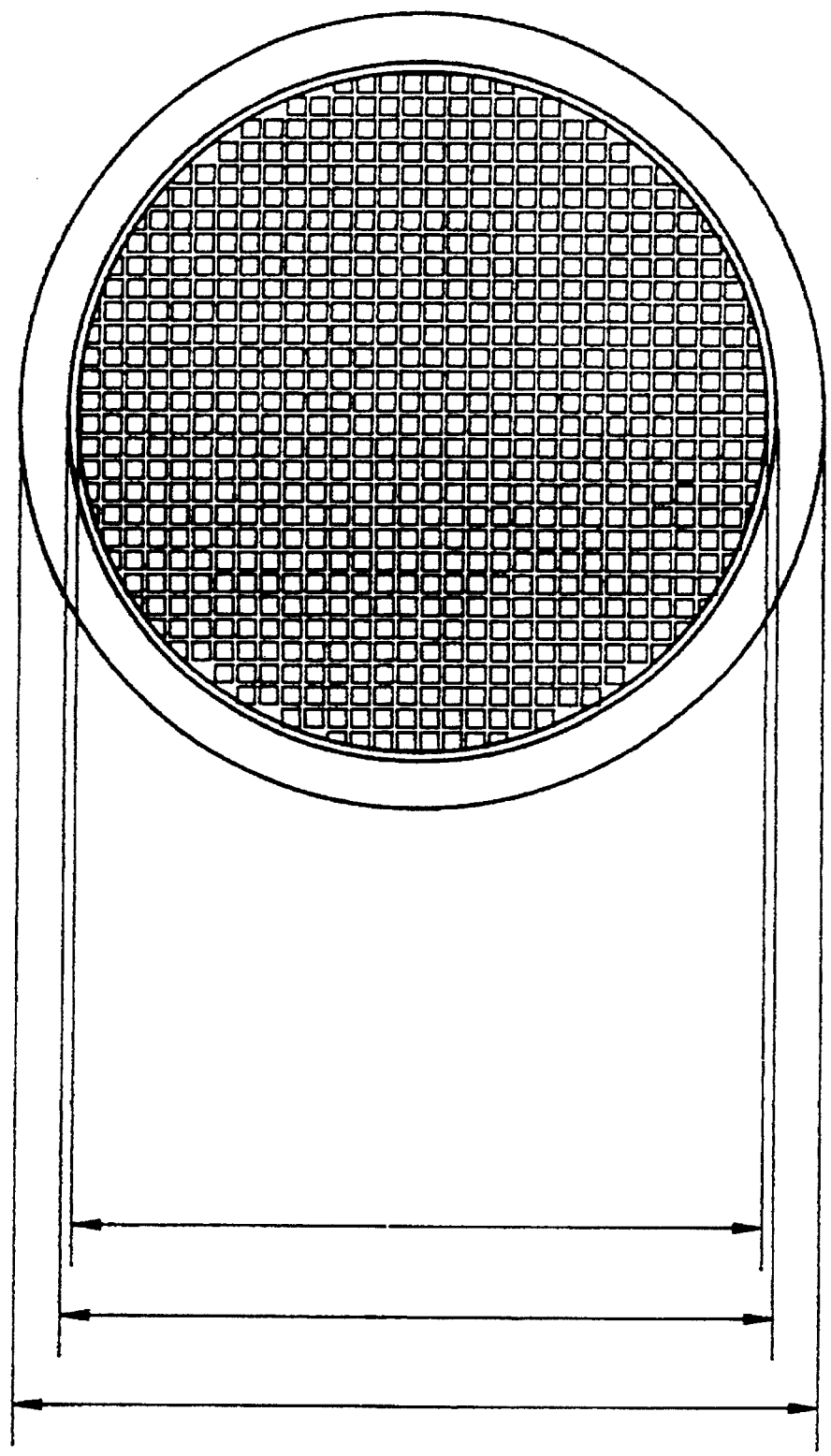
FIG. 10 shows a preferred form of chuck surface pattern in accordance with the invention.

The surface of the ESC is patterned by machining grooves into the ceramic, creating "contact" regions 14', where the Si wafer and ESC form an intimate contact, and "grooved" regions, where the Si wafer and ESC have a fixed separation to accommodate a gas at a relatively constant static pressure. Two types of surface patterns were analyzed and used for experimental verification: a reference "ring" pattern type consisting of circumferential contacts, as shown in FIG. 2c, and a waffle pattern type consisting of small square contacts in accordance with a preferred embodiment of the invention, shown in FIG. 10. The grooves in the chuck were 13 µm deep for both ESC surface patterns. However, in the reference "ring" pattern, the grooves were approximately 0.6 cm wide and separated by contact regions of about 0.66 cm in the radial dimension. In the pattern of FIG. 10, the rectangular contact pads were 0.3 cm wide separated by grooves having a slightly greater width for the waffle pattern. The area of the contact region (e.g., contact fraction) on the surface of the ESC, excluding the outer contact region, was varied between 24–38% in several chucks of each pattern type. In both patterns, a relatively large circumferential contact region is produced at the edge of the ESC to provide enhanced heat removal in order to reduce the temperature over the region of the wafer which overhangs the ESC.

As shown in FIG. 2b, the surface roughness of the ESC face was nominally 0.2 to 0.5 microns and it has been discovered by the inventors that the wafer temperature was proportional to the surface roughness (the greater the roughness, the higher the wafer temperature, with all else being equal) in much the same manner that changing the nominal contact area fraction (e.g. the area of the chuck face 14 less the area of grooves 16, divided by the area of the chuck face, or the area of areas 14' divided by area 14). For reference, this surface roughness was much greater than the surface roughness of a polished Si wafer and about the same as an unpolished Si wafer (which is about 0.3 µm). Changing the nominal contact area fraction together with a nominal surface roughness was thus determined to be a good way to manufacture chucks for operation at different wafer temperature ranges (e.g., a chuck with a lower contact area fraction would result in a higher wafer temperature for a given operation). That is, in accordance with the invention, choosing a contact area fraction as a function of both nominal contact area fraction and nominal surface roughness determined the nominal wafer temperature for a given set of reaction conditions.

During simulated or actual deposition, as described above, an RF power density of 7 watts/cm² was applied to the wafer. The pressure of the He between the ESC and wafer ($P_{He}$), and the ESC clamping voltage ($V_{ESC}$), are varied between 0–10 Torr and 400–1,000 volts, respectively. Under various combinations of these conditions, the average wafer temperature was controlled from 180° C. to 450° C. For the experiments and simulations described here, the wafer temperature and temperature uniformity were determined while operating the reactor under deposition-like conditions, with an Ar plasma substituted for the reactive gas mixture. The steady-state wafer temperature was measured in real-time at one location about mid-radius on the wafer using a fiber optic infrared detector located behind the wafer. Wafer temperature uniformity was determined using a mapping technique which relies on a change in resistivity of the film (although any other measurable property of the film such as optical properties, thickness, etc. could theoretically be used) with time-temperature exposure. This technique measures the temperature with a spatial resolution of ~0.2 cm and has a relative temperature sensitivity of <±1° C. and an absolute accuracy of ±7° C.

It was found from these experiments that the temperature of the wafer during CVD deposition is a function of 1.) the ESC clamping voltage, $V_{ESC}$, 2.) the pressure of the He between the ESC and wafer, $P_{He}$, 3.) the ion flux incident on the surface of the wafer, $F_i$, 4.) the temperature on the backside of the ESC, $T_{ESC}$, 5.) the surface roughness of the chuck, and 6.) the thermal transport of heat from the top surface of the silicon wafer to the bottom of the ESC. Because of the relatively high thermal conductivity of the Si wafer and the ESC compared with the interface region between the wafer and the ESC, a large temperature gradient occurs near the wafer/ESC interface.

Analysis of the results of these experiments and the development of a mathematical model for simulation of the performance of an electrostatic chuck will now be described. That is, changing the He pressure and the ESC voltage allowed the temperature to be varied around the nominal temperature determined by the contact area fraction of the chuck. It was found that changing the nominal contact area fraction was better than modifying the roughness since the nominal contact area fraction could be controlled with a high degree of accuracy and intimacy of contact between the wafer and the ESC for a given surface roughness was, in theory, adjustable by adjusting the clamping voltage and thus, the, clamping force of the wafer against the chuck.

In accordance with the invention, a numerical model has been developed which predicts the temperature distribution of a Si wafer placed on an ESC. The results from the model indicate that once the heat coefficients of the ESC have been determined, excellent agreement is obtained between the measured and predicted wafer temperature uniformity. The development of this numerical model of the wafer-ESC interface will now be described in detail with reference to FIGS. 3a, 3b, 4 and 5.

A value for the average heat transfer coefficient between the wafer and the ESC, $h_a$, is estimated by measuring the temperature $T_W$ (using temperature probe 190, as shown in FIG. 1) of the wafer at mid-radius during the deposition-like conditions for various values of the ESC clamping voltage $V_{ESC}$, and He supply pressures $P_{He}$. This measured temperature is assumed to represent an average temperature of the wafer. The value of $h_a$ is then obtained from:

$$h_a = \frac{F_i}{T_w - T_{ESC}} \quad (1)$$

where $T_{ESC}=80°$ C. is the temperature of the ESC and $F_i=5.7$ watts/cm$^2$ (taken as 80% of the RF power density of the plasma) is the applied heat flux to the wafer surface. This value is consistent with the Langmuir probe measurements which indicate that 80% of the RF power is transferred to the ions. The value of 80° C. for the temperature of the ESC is consistent with the results from the thermal model which indicate that the ESC temperature is uniform except over a small region at the wafer/ESC interface.

Figure 3A:
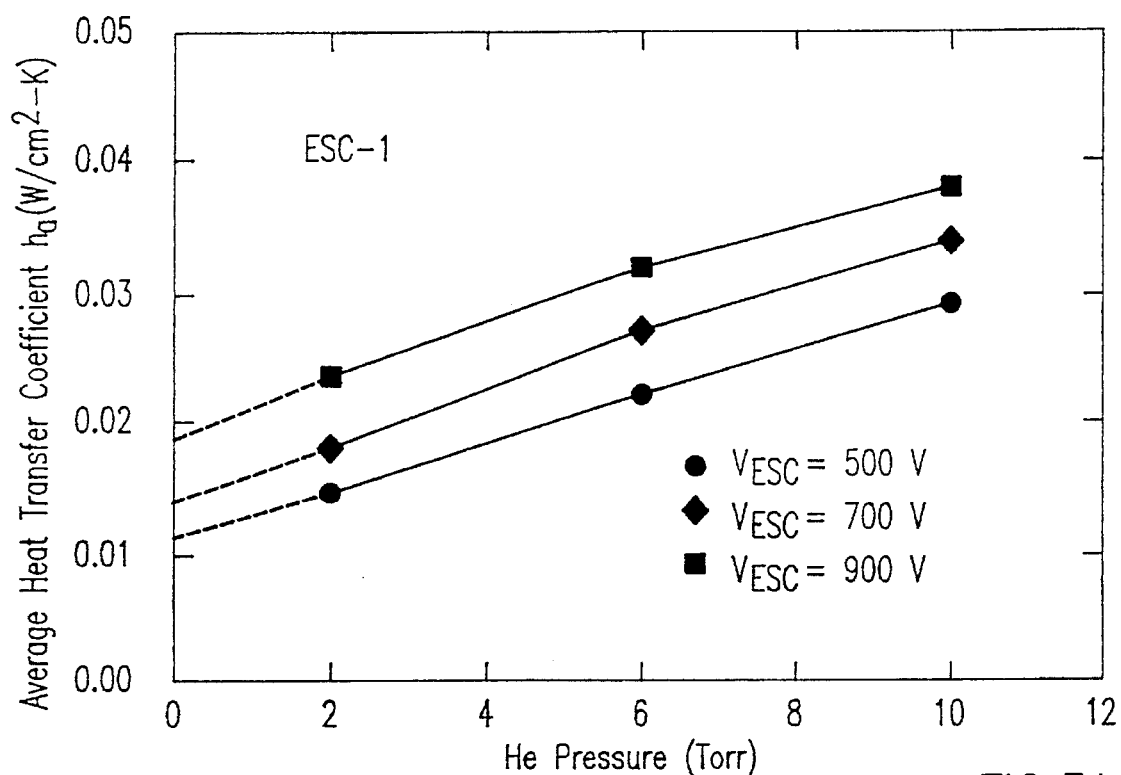
FIG. 3a shows the values of the average heat transfer coefficient between the wafer and the ESC ($h_a$) obtained for a typical ESC, referred to as ESC-1, as a function of the helium pressure ($P_{He}$) from 0 to 10 Torr and for various values of the ESC clamping voltage ($V_{ESC}$) up to 1,000 volts.
Figure 3B:
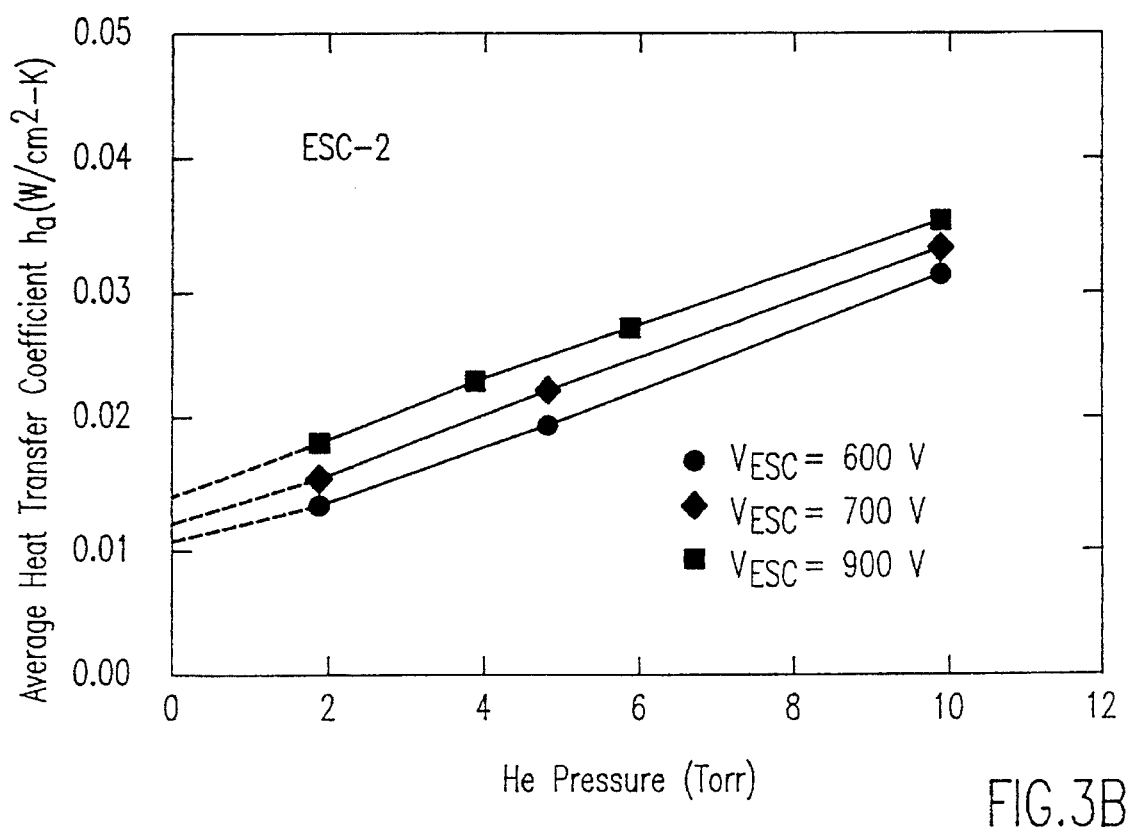
FIG. 3b shows the values of the average heat transfer coefficient between the wafer and the ESC ($h_a$) obtained for another ESC, referred to as ESC-2, as a function of the helium pressure ($P_{He}$) from 0 to 10 Torr and for various values of the ESC clamping voltage ($V_{ESC}$) up to 1,000 volts.

FIGS. 3a and 3b show the values of $h_a$ obtained for two ESCs as a function of $P_{He}$ from 0 to 10 Torr and for various values of $V_{ESC}$ up to 1,000 volts. As shown in FIGS. 3a and 3b, for a specified $V_{ESC}$, the average heat transfer coefficient $h_a$ is found to be linear with respect to $P_{He}$. This behavior is consistent with Knudsen's theory of heat conduction between parallel plates where the total heat transfer is linear with pressure as long as the plate separation is small with respect to the mean tree path in the gas. Change of $V_{ESC}$ causes a relatively linear vertical shift of the linear relationship between average heat transfer coefficient $h_a$ and gas pressure $P_{He}$. For a typical operation condition with constant $P_{He}=5$ Torr and $V_{ESC}=600$ volts, the average heat transfer coefficient $h_a$ is about 0.024 watts/cm$^2$·°K, and the temperature of the wafer is ~400° C.

As may be seen from a comparison of FIGS. 3a and 3b, the inventors have also discovered that, because the surface roughness can differ between various ESCs (e.g., ESC-1 and ESC-2), the heat transfer from the wafer to the ESC can vary, resulting in a different wafer temperature for the same operating conditions of $P_{He}$ and $V_{ESC}$. If controlling the surface finish of the ESC is problematic, wafer temperature will change from chuck to chuck. In addition, changing the area fraction of the ESC surface which is in intimate contact with the wafer ($X_c$) will also change the heat transfer properties and alter the temperature of the Si wafer. This similarity of effect leads the inventors to theorize that change of $V_{ESC}$ alters the intimacy of contact between the ESC (for a given degree of surface roughness) and the polished rear surface of the wafer. While not wishing to be held to any particular theory accounting for this effect, the inventors consider that the combination of chuck surface roughness exceeding the surface roughness of the wafer and some degree of local elasticity of the chuck surface and/or the back surface of the wafer allows some degree of change of effective contact fraction with change of electrostatic clamping force in a manner substantially proportional to $V_{ESC}$.

Figure 4:
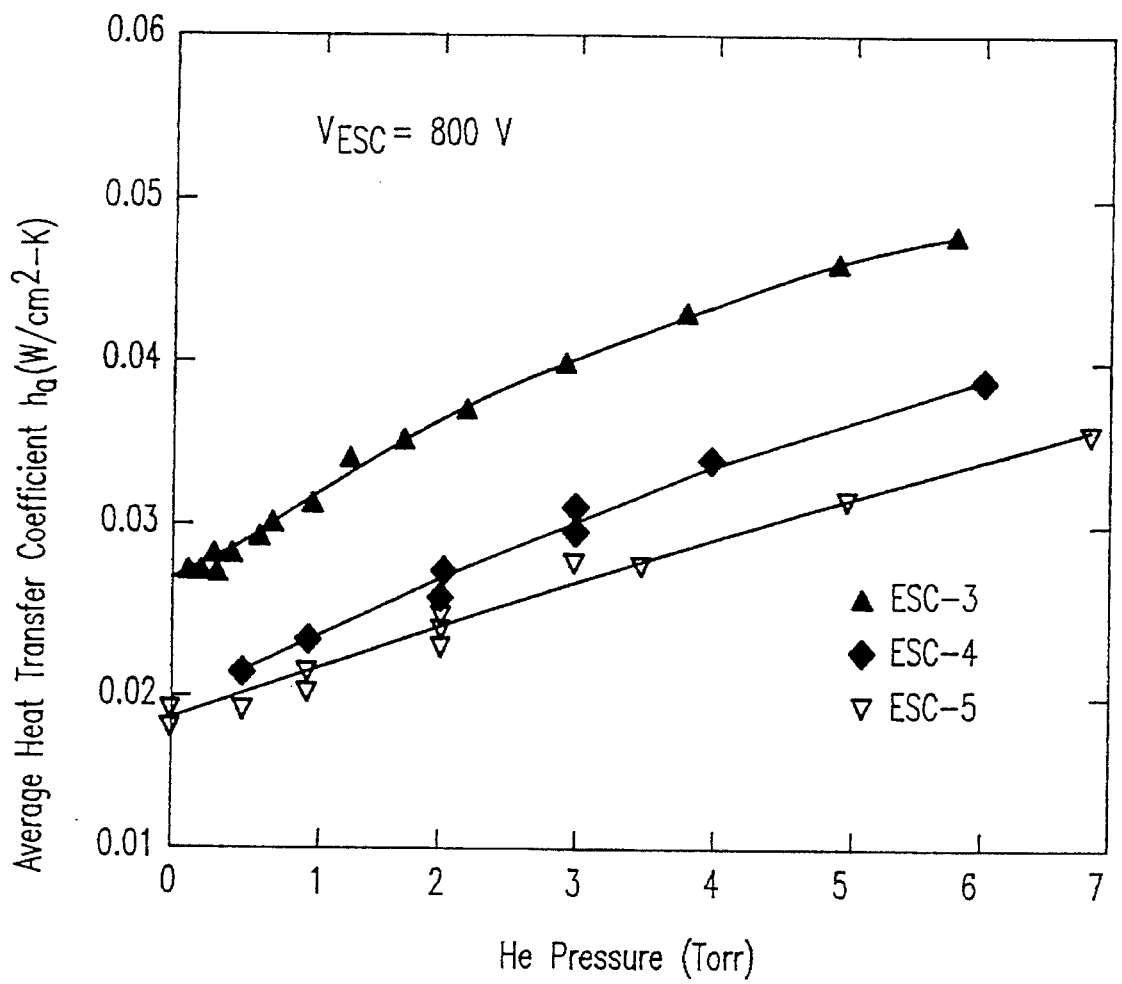
FIG. 4 shows the measured value of the average heat transfer coefficient due to the physical contact between the Si wafer and the ESC ($h_c$) as a function of the He pressure ($P_{He}$) for three different ESC chucks, referred to as ESC-3, ESC-4, and ESC-5, when operated with $V_{ESC}$=800 volts.

To verify this effect, FIG. 4 shows the measured value of $h_c$ as a function of the He pressure $P_{He}$, for three different ESC chucks, referred to as ESC-3, ESC-4, and ESC-5, when operated with $V_{ESC}=800$ volts. These three chucks all have a similar surface pattern geometry with the same fraction of "contact" to "grooved" areas. The surface roughness on chucks ESC-4 and ESC-5 are similar to that of ESC-1. The surface of ESC-3 is considerably smoother than all the other chucks and thus has the highest value of $h_a$. The value of $h_a$ is found to be nearly linear with respect to $P_{He}$. The slight decrease from linearity at the higher pressures is believed to be due to the competition between the helium pressure, which tends to separate the wafer from the ESC and the electrostatic potential which forces them together. This effect is particularly evident on chuck ESC-3.

Controlling the surface finish of the ESC is therefore considered to be important to reducing wafer temperature variations from chuck to chuck and to obtain consistent performance in the practice of the invention. In addition, changing either the nominal contact area fraction on the ESC surface which is in intimate contact with wafer, or varying the surface roughness in a controlled way, will alter the heat transfer properties of the chuck and change the temperature of the wafer.

To better understand the effects of the contact area fraction of the "contact" region and the surface roughness on the value of the average heat transfer coefficient $h_a$ in the further development of the numerical model of the wafer-ESC interface, it is useful to examine the two contributions to $h_a$: 1.) the heat transfer due to the physical contact between the Si wafer and the ESC ($h_c$), and 2.) the heat transfer due to the presence of the He gas ($h_g$). At $P_{He} \leq 10$ Torr, where the depth of the groove and the distance between the wafer and ESC in the contact region are both small relative to the mean free path in the He and the width of the grooves, the heat transfer due to $h_g$ does not depend on the details of the pattern machined into the surface of the ESC. Thus $h_a$ can be written as:

$$h_a = X_c h_c + h_g \quad (2)$$

where $X_c$ is the localized area fraction of the ESC which is in intimate contact with the wafer. The value of $h_c$ is a function of $V_{ESC}$, $P_{He}$, and the surface roughness of the ESC. The value of $h_g$ depends only upon $P_{He}$ and the gas itself (i.e. argon gas would result in a different $h_g$ for the same pressure).

When $P_{He}=0$, the contribution of the He to the heat transfer vanishes and Eq. (2) reduces to $h_a=X_c h_c$. Since the value of $X_c$ is known, the value of the heat transfer over the regions where there is intimate contact between the wafer and ESC can be obtained. For a given $V_{ESC}$, the value of $h_c$ can be used as a direct measure of the impact of the surface roughness of the ESC surface on the heat transfer properties of the ESC.

Figure 5:
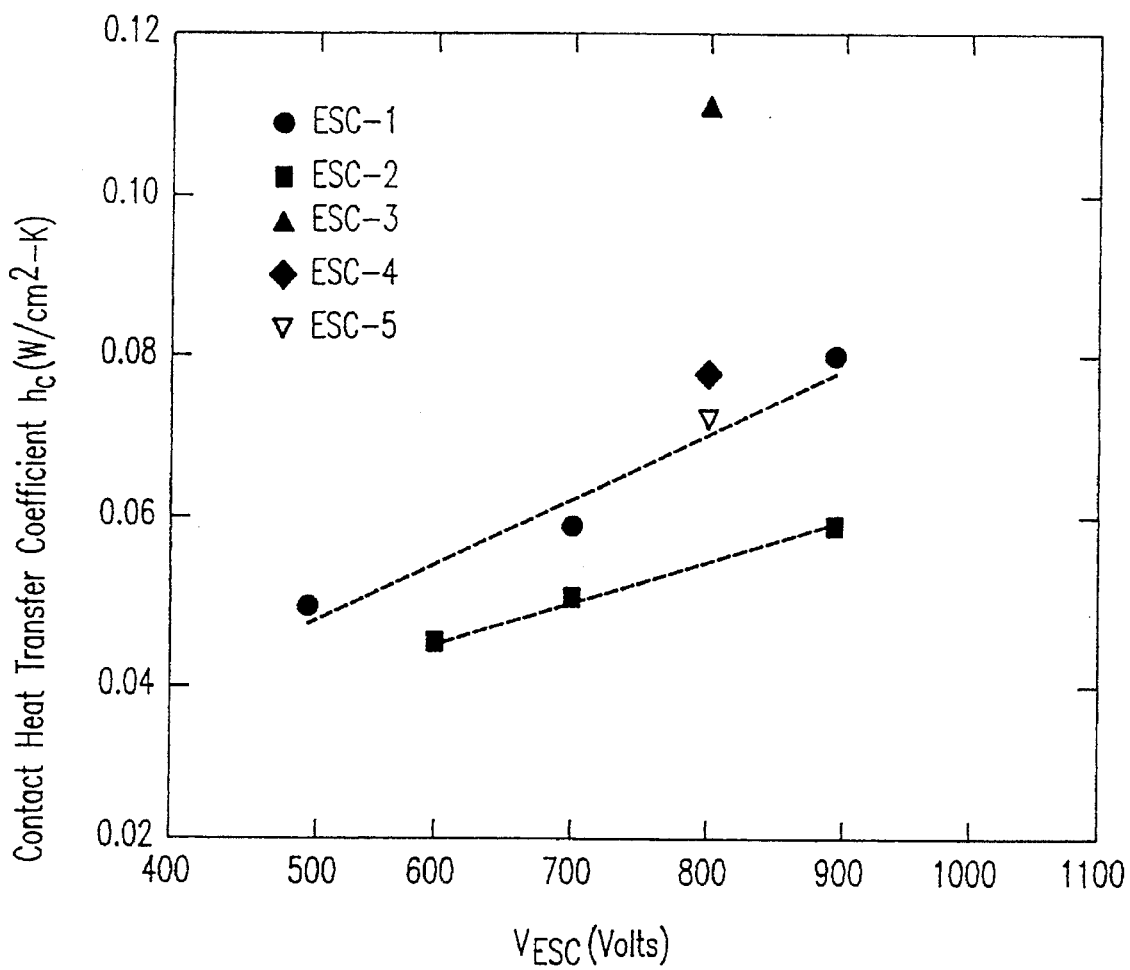
FIG. 5 shows the behavior of $h_c$ as a function of $V_{ESC}$ from 400 to 1,000 volts measured on the five different ESCs in FIGS. 3a, 3b, and 4.

FIG. 5 shows the behavior of $h_c$ for the five different chucks described in FIGS. 3a, 3b, and 4. For ESC-1 and ESC-2, the value of $h_c$ is obtained by extrapolating the data of FIGS. 3a and 3b to obtain the y-intercept values; for ESC-3 through ESC-5, the value of $h_c$ with $P_{He}=0$ was measured. The value of $h_c$ is lowest for the ESC with the greatest surface roughness (ESC-2) and highest for the ESC with the least surface roughness (ESC-3). The value of $h_c$ is found to increase monotonically with increasing values of $V_{ESC}$ which is believed to be due to an increase in the intimacy of contact between the wafer and the ESC (e.g. effectively adjusting the contact area fraction, possibly by elastic deformation of the wafer and/or the ESC). The value of $h_c$ is somewhat more strongly dependent upon the surface roughness of the ESC than the value of $V_{ESC}$. For example, with $V_{ESC}=800$ volts, the values of $h_c$ could be varied by a factor of 2×, from a value of 0.054 to 0.11 watts/cm$^2$·°K by changing the surface roughness of the chucks, while the value of $h_c$ only increased by a factor of 1.6×, from a value of 0.047 to 0.079 watts/cm$^2$·K when increasing $V_{ESC}$ from 500 to 1,000 volts. It is for this reason that control of chuck surface roughness is preferred for establishing a nominal wafer temperature range in a given semiconductor processing operation for a given nominal contact area fraction of the groove pattern of the ESC, as alluded to above.

Figure 6A:
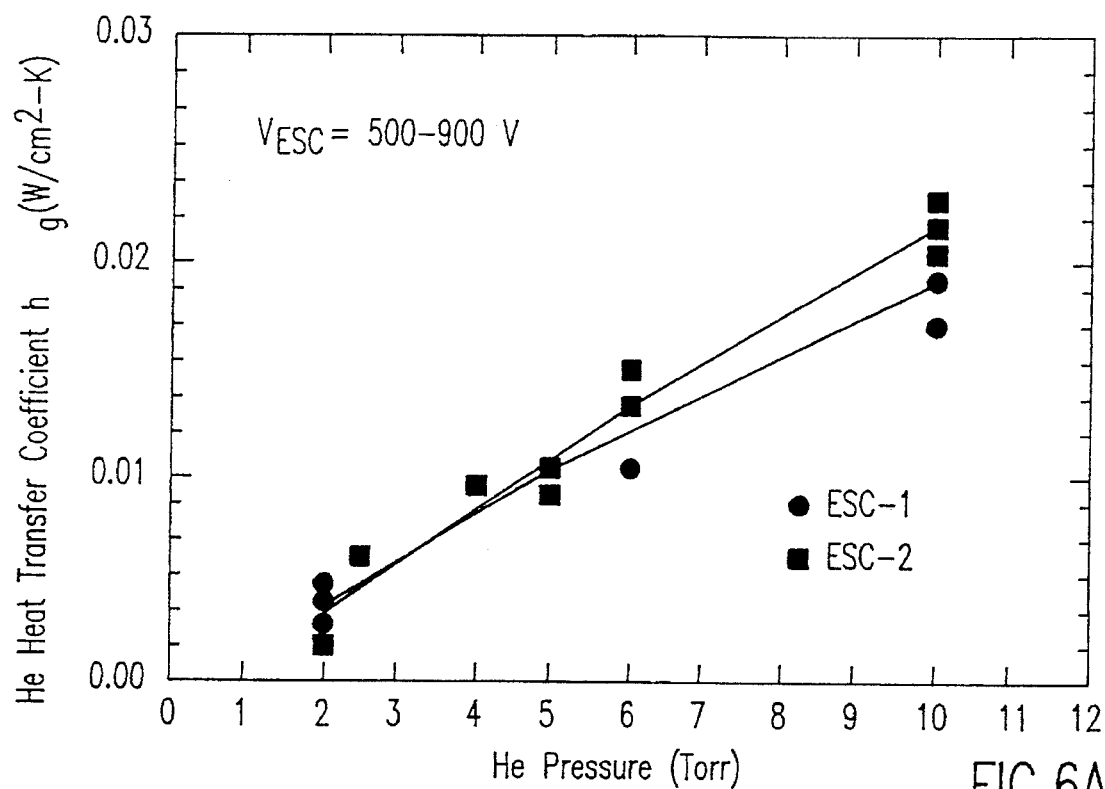
FIG. 6a shows the calculated values of the heat transfer coefficient ($h_g$) as a function of $P_{He}$ for ESC-1 and ESC-2 in FIGS. 3a and 3b.
Figure 6B:
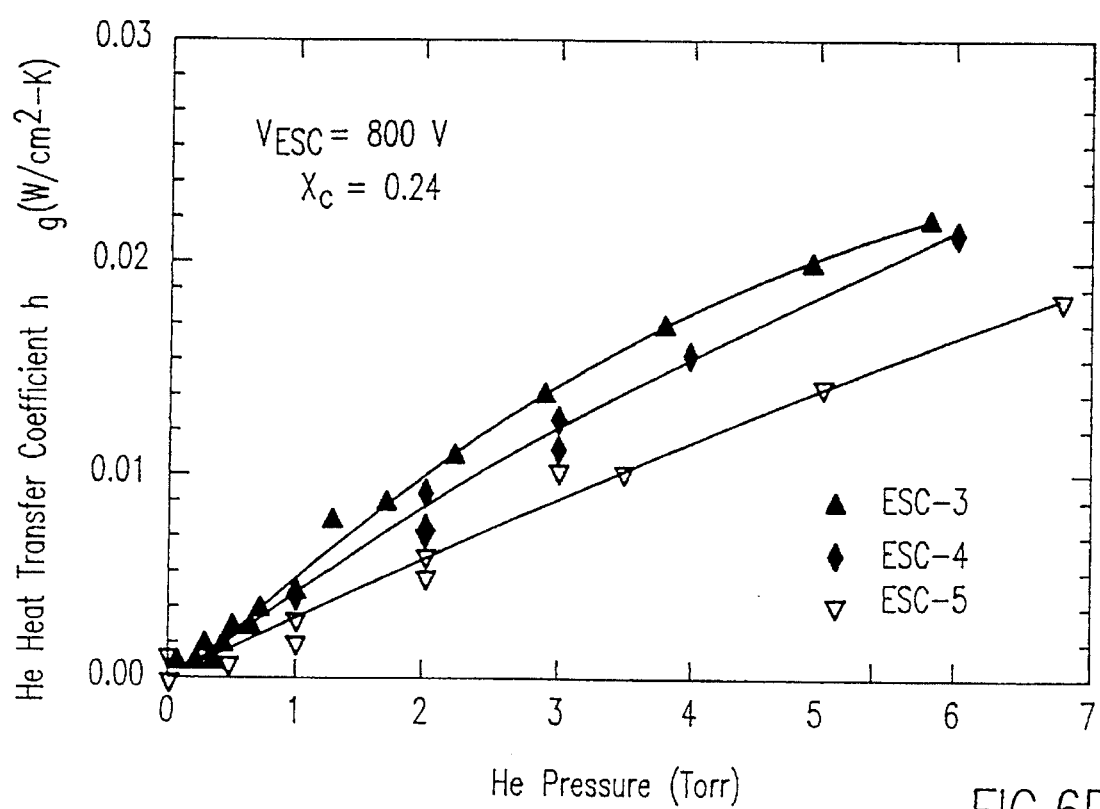
FIG. 6b shows the values of $h_g$ as a function of $P_{He}$ for ESC-3, ESC-4, and ESC-5 with $V_{ESC}$=800 volts.

Once the values of $h_a$ and $h_c$ are known, the value of the heat transfer coefficient due to the presence of the He, $h_g$, can be obtained from Eq. (2). FIG. 6a shows the calculated values of $h_g$ as a function of $P_{He}$ for ESC-1 and ESC-2. The values of $h_g$ are plotted for all three values (e.g. 500 V, 700 V, 900 V) of $V_{ESC}$, since there is no distinguishable variation in $h_g$ as a function of $V_{ESC}$. FIG. 6b shows the values of $h_g$ as a function of $P_{He}$ for ESC-3 through ESC-5, with $V_{ESC}$=800 volts. At $P_{He}$=5 Torr, a variation in $h_g$, of 3× is observed among the different chucks (in FIGS. 6a and 6b). This variation is believed to be due to possible inaccuracy in obtaining $h_a$ at $P_{He}$=0 since a zero pressure condition is ideal and can only be approached in practice. The data in both FIGS. 6a and 6b show a nearly linear dependence of $h_g$ on $P_{He}$ as would be expected. Comparing the results from FIGS. 5 and 6a for ESC-1, at $P_{He}$=10 Torr, the value of $h_g$ is 0.023 watts/cm·K, which is ~20× smaller than $h_c$, the contribution due to intimate contact. Thus, properly choosing the size and roughness of the "contact" regions is critical for obtaining the proper wafer temperature.

With the above observations, numerical models were developed to calculate the temperature at the surface of the wafer placed on an ESC having different surface patterns. A 2-D azimuthally symmetric simulation is used to model the wafer temperatures resulting from the circumferential ESC surface pattern, while a 3-D simulation is used to model the waffle pattern. The model system consists of three layers: the Si wafer, the ESC, and an interfacial layer separating the wafer from the ESC which was developed as discussed above. This interfacial layer represents the contact region between the wafer and the ESC and contains the details of the geometry of the surface pattern on the ESC.

The wafer is modeled with a temperature dependent thermal conductivity $k_{si}$ given by $k_{si}$=71.5/(T−99)cal/(cm·s·°K) (see G. E. Jellison and F. A. Modine, Appl. Phys. Lett., 41, 180 (1982)), where T is the temperature in °K, and the ESC with a constant thermal conductivity $k_{ESC}$=0.015 cal/(cm·s·°K). The thermal effects due to the electrode embedded in the ESC are ignored. The interfacial layer between the top surface of the ESC and the backside of the wafer can be thought of in terms of a heat transfer coefficient h, whose value is spatially modulated in accordance with the groove pattern machined into the surface of the ESC. Thus h=$h_c$+$h_g$ at the "contact" regions and h=$h_g$ at the "grooved" regions.

The value of h was modified over the outer contact region at the edge of the ESC. Here, there is both drop in He pressure (from the static pressure $P_{He}$ at inside boundary of the final contact region to a pressure on the order of 1 mTorr at the outside boundary of the contact region, at high vacuum corresponding to ECR-CVD process conditions) due to leakage of gas and a reduction in the electrostatic clamping voltage. In the models, the value of $h_g$ was either linearly reduced to zero between the inner and outer edge of the final contact region to represent the reduction in He pressure, or a step function was imposed on the value of $h_g$, reducing its value to zero at a distance near the edge of the ESC where the tungsten electrode terminates. Both methods were found to give satisfactory results.

The steady-state temperature distribution in the wafer and in the body of the ESC is obtained by solving the equation for the conservation of energy:

$$v \cdot k_a(T) \nabla T = 0 \qquad (3)$$

where $k_a(T)$ is the thermal conductivity of either the wafer or the ESC and T is the temperature, where v is an operator such that $$\nabla = \frac{\partial}{\partial x} \hat{a}_x + \frac{\partial}{\partial y} \hat{a}_y + \frac{\partial}{\partial z} \hat{a}_z$$

and $$\nabla = \frac{\partial T}{\partial x} \hat{a}_x + \frac{\partial T}{\partial y} \hat{a}_y + \frac{\partial T}{\partial z} \hat{a}_z.$$

where $\hat{a}_x$ is the unit vector in the x direction, $\hat{a}_y$ is the unit vector in the y direction, and $\hat{a}_z$ is the unit vector in the z direction.

The following boundary conditions are imposed on the solution of Equation (3):

1) A uniform flux of energy, $F_i$, is applied to the top surface of the wafer. This energy is caused by ion bombardment from the plasma and represents 80% of the applied RF power during the oxide deposition process;

2) A constant temperature of 70° C. is maintained on the back surface of the ESC. This temperature is fixed by the temperature of the water flowing through the plate on which the ESC is mounted. The temperature in the body of the ESC is calculated along with the temperature of the wafer surface;

3) The heat transfer between the wafer and ESC satisfied the relation:

$$q(\vec{r}) = h(\vec{r})(T_{wb}(\vec{r}) - T_{ef}(\vec{r})) \qquad (4)$$

where $h(\vec{r})$=$h_c$+$h_g$ in the regions where the wafer and ESC are in intimate contact and $h(\vec{r})$=$h_g$ where the wafer and ESC are separated by the groove. The values of $T_{wb}(\vec{r})$ and $T_{ef}(\vec{r})$ are the temperatures on the back surface of the Si wafer and the front surface of the ESC at position $\vec{r}$, respectively. Special consideration is given to the contact region at the edge of the ESC as discussed above.

Radiation loss and heat loss to the walls of the reactor are not included in the model. At the maximum wafer temperature arising in this process of 650° K, the radiation loss per unit area is 0.4 watts/cm$^2$, using an emissivity of 0.4. This represents only ≅7% of the incident flux of heat to the wafer and can be neglected to first order. The loss of heat to the reactor walls due to conduction and convection were likewise ignored due to the low pressure of <1 mTorr and low flow rates used during the deposition process.

Once the values of the heat transfer coefficients, $h_c$ and $h_g$, of a particular ESC have been determined, the temperature distribution is calculated in both the wafer and in the ESC by solving Eqs. (2) and (3) using finite element technique (see FIDAP CFD Code, commercially available from Fluid Dynamics International, Evanston, Ill.). Of particular importance is the calculated temperature distribution at the surface of the wafer.

Figure 7:
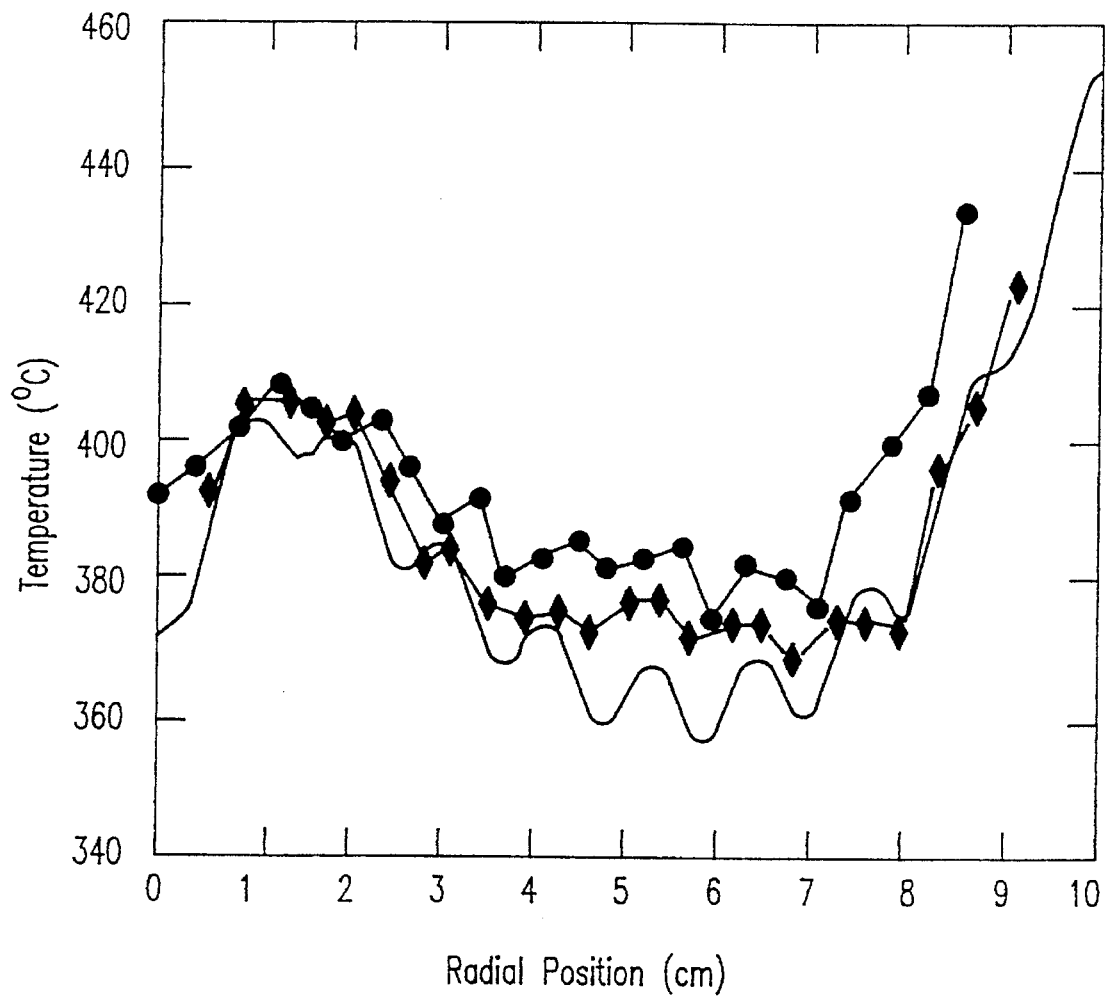
FIG. 7 shows the calculated (solid curve) and measured (data points and dashed curves) wafer temperature distributions for an ESC having the groove pattern shown in FIG. 2c.
Figure 8A:
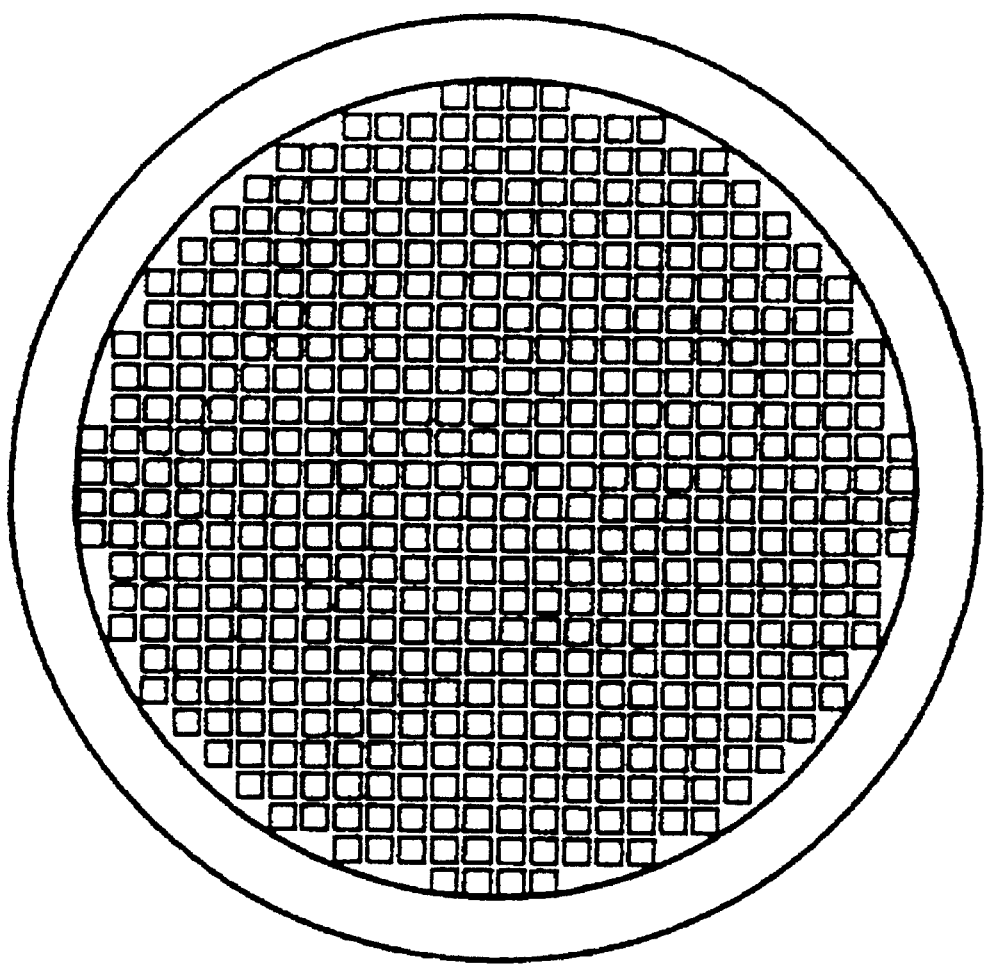
FIG. 8a shows a waffle type chuck surface pattern consisting of small square contacts in accordance with a preferred embodiment of the invention.
Figure 8B:
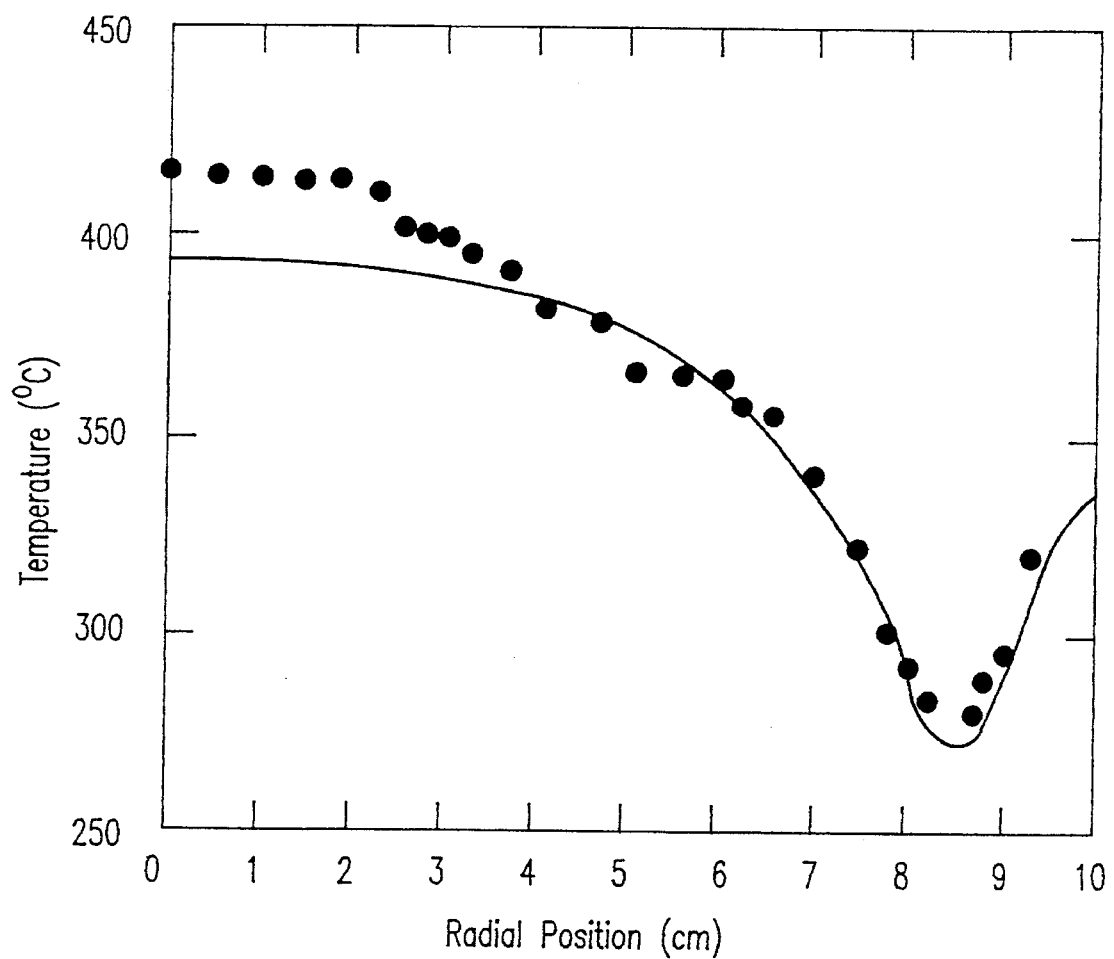
FIG. 8b shows, for purposes of a comparison with FIG. 7, the calculated (solid curve) and measured (data points and dashed curves) wafer temperature distributions for an ESC chuck having a groove pattern shown in FIG. 8a and operated under similar conditions used in deriving the data shown in FIG. 7.

FIGS. 7 and 8b show the calculated (solid curve) and measured (data points and dashed curves) wafer temperature distributions for two electrostatic chucks with different surface patterns operated under similar conditions. The data in FIG. 7 was obtained from an ESC having a circumferential "contact" pattern similar to FIG. 2c while that in FIG.

8b was obtained from an ESC having waffle "contact" pattern similar to that shown in FIG. 10. The radius of both chucks is 0.5 cm smaller than the wafer. Because of the relatively high thermal conductivity of the wafer and ESC compared to the interfacial region between the wafer and the ESC, most of the temperature drop between the top wafer surface and the bottom of the ESC occurs at the interface between the wafer and the ESC. Under all conditions studied, the temperature drop within the bulk of the ESC was ≦10° C.

The calculated temperature distribution shown in FIG. 7 initially increases with increasing radius, gradually decreases before rising again near the edge of the wafer. The reduction in temperature at the center of the wafer is caused by the large "contact" region at the center of the ESC which serves as an enhanced heat sink. The decrease in temperature with increasing radius is due to an increase in the area fraction of the "contact" regions with increasing radius and to a wide diameter "contact" pad at the edge of the ESC. The temperature rise at the edge of the wafer is due to the reduction in the heat transport at the edge of the wafer which overhangs the ESC. The small temperature oscillation which occurs every approximately 1.2 cm directly corresponds to the periodicity of "contact" and "grooved" regions on the surface of the ESC indicating that grooves and contact regions are too wide relative to the thermal conductivity of the wafer and in consideration of the relative heat transfer contributions of the contact regions of the chuck and the gas contained in the grooves. (While the periodicity of the grooves to avoid the oscillations observed in FIG. 7 for a known ESC surface pattern depends on many factors and becomes more critical as wafer thickness is reduced, it has been found by the inventors that for silicon wafers a periodicity of less than ten times the wafer thickness provides uniformly acceptable results. Periodicity of the groove pattern for wafers of other semiconductor materials can be scaled from this guideline based on relative thermal conductivity.) The wafer temperature distribution was measured along a diameter of the wafer. The two experimental curves represent this data. As can be seen, the model captures the basic features of the measured temperature distribution.

The predicted temperature of the wafer having a contact or groove pattern similar to that depicted in FIG. 8a is shown in FIG. 8b. This temperature initially decreases gradually as a function of radius up to a radius of about 6 cm, then the temperature decreases sharply towards the edge of the wafer. The sharp decrease in temperature is due to the enhanced heat sink caused by the large contact region at the edge of the ESC. Because of the smaller spacing between "contact" regions (0.3 cm vs. 0.6 cm in FIG. 7) wafer temperature oscillations are not observed in the predicted or the measured temperature profiles.

In order to further improve the temperature uniformity with this "contact" pattern, the size of the final, outer, "contact" region needs to be chosen to better balance the heat transfer from the edge of the wafer. That is, to remove the energy incident on the area which is not in contact with the chuck where the wafer edge overhangs the outer perimeter of the chuck face which would otherwise increase the temperature of adjacent areas of the wafer. In other words, when a condition is achieved where heat transfer from the edge of the wafer is balanced by the area of the outer annular contact region, the central area of the wafer within the inner boundary of that annular contact region is unaffected by the "excess" energy incident on the overhang of the wafer and which does not have a corresponding area of the chuck face. It can be thus readily understood that the optimum width of the annular contact region will increase (or decrease) with increasing (or decreasing) wafer overhang since the "excess" incident energy will vary with the area of the overhang. Thus while achievement of this balance requires an increase in the area of the outer contact region in comparison with other ESC surface patterns known in the art, the outer contact region can all be made too large, particularly in the case of the preferred embodiment of the invention in which the ESC is preferably sized to reduce wafer overhang relative to the present practice.

Figure 9:
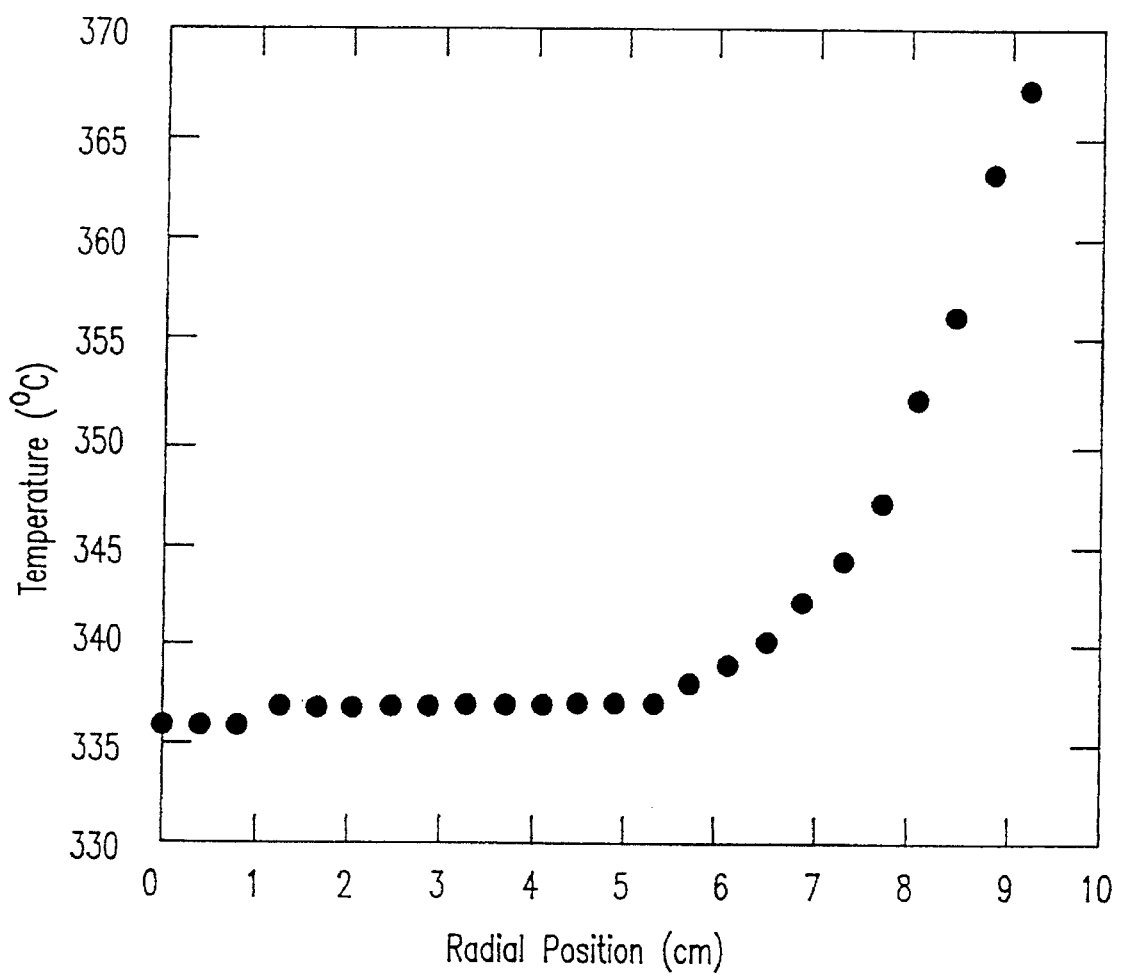
FIG. 9 shows the temperature uniformity profile for the improved ESC.

The effect of balancing this excess energy with the outer annular contact region can be seen from a comparison of FIG. 8b and FIG. 9. It will be recalled from the foregoing discussion that the outer contact region of the pattern producing the temperature profile of FIG. 8b was determined to have an annular contact region of excessive width. The effect of this excessive width is seen both in the downward slope with increasing radius (e.g. proximity to the outer contact region), indicating that heat is being conducted radially through the wafer, and the downward concavity of the curve which increases with proximity to the annular contact region. In contrast, the temperature profile shown in FIG. 9 is essentially flat to the inner periphery of the annular region, indicating minimal temperature gradient along the radius of the wafer and fully exploiting the constant contact area fraction of the central portion of the chuck. It should be noted that, in accordance with the preferred embodiment of the invention, the chuck has a larger radius less than 1.0 mm smaller than the wafer diameter) to reduce overhang (and the outer annular region width has been optimized for this overhang) and the rise in temperature over the outer portion of the wafer is held to about 30° C. The periodicity of the waffle pattern has also been optimized to wafer thickness to avoid the oscillations observed in FIG. 7 for the known ESC surface pattern. Again, the model captures the basic features of the measured temperature distribution and good agreement is obtained between the measured and predicted temperature distributions. There are no free parameters in the temperature model.

It should also be understood that the nominal (local) contact area fraction of the outer annular contact region is equal to one but that the effective contact area fraction is affected by surface roughness and the clamping voltage, as described above. Also, it should be recalled that $h_c$ is substantially greater than $h_g$ and that $h_g$ is unaffected by clamping voltage and varies only with gas pressure. Therefore, clamping voltage can also be used as a coarse adjustment of the balancing of the "excess" incident energy or heat and a fine adjustment can be provided by adjustment of gas pressure because of the difference in contact area fraction between the central and outer, annular regions of the ESC face. Therefore, the width of the outer, annular contact region need only be of a nominal width which will allow a balance to be achieved within acceptable ranges of values of clamping voltage and gas pressures. A preferred working value of the width of the outer, annular region which will allow "excess" energy to be balanced is approximately 2.0 to 2.5 times the nominal overhang dimension. As a variation of the invention it should also be noted that the surface roughness of the outer, annular portion or rim need not be the same as the surface roughness of the central portion defined by the groove pattern or even constant over the width of the outer, annular portion. That is, in some cases it may be desirable to provide a surface roughness of the outer, annular portion of the surface which has a roughness which is reduced and/or graded in comparison with the central portion of the pattern. In such a case, reduced roughness could allow a reduced width of the outer, annular portion and extend the region of constant temperature closer to the wafer edge. Such a variation of the invention would also allow different rates of adjustment of effective contact area with adjustment of clamping voltage.

To determine the nominal value of the width of the outer, annular portion of the ESC surface pattern referred to above, consider two differently sized chucks which provide 5 mm and 1 mm overhangs respectively for a 10 cm radius wafer. When the width of the outer contact region is optimized for each ESC optimal contact widths of 3.2 cm and 1.0 cm are obtained, respectively. Thus, the contact width, divided by the overhang yields figures of 3.2 and 10, respectively.

The reason the relatively large difference between these ratios depend on the amount of overhang is due to 1.) the fact that the tungsten electrode is recessed about 0.3 cm from the edge of the ESC, and 2.) the fact that the heat transfer due to gas pressure decreases from a few Torr to zero across the width of the contact region. If the second effect is neglected (since it is small) and define the effective ESC radius as the radius of the tungsten electrode (e.g. the radius of the ESC minus 0.3 cm) to approximate the reduced effects of the electrostatic potential, the optimum contact area width ratios based on effective ESC radius and increased effective overhang for the two ESCs are 2.0 and 2.5, respectively, which are is relatively good agreement. However, this proportion may be varied with the proportion of the effective contact area fraction of the central region and the effective contact area fraction of the outer, annular region for particular surface roughnesses (and which can differ between these regions) as well as the desired temperature of the wafer and the RF power applied. Conversely, a width of the outer, annular region may be designed, using the mathematical model described above, for particular values of constant central contact region nominal area fraction, clamping voltage, surface roughness and gas pressure.

The results from these models indicate that once the heat transfer coefficients of the ESC have been determined, good agreement can be obtained between the measured and predicted wafer temperature uniformity. Thus, the numerical model can be used to provide insight into the effects of the operating and design parameters of the ESC on the wafer temperature uniformity. The models can also be used as a design tool to improve the geometry of the ESC surface pattern to reduce the nonuniformities in temperature at the wafer surface.

For example, using a chuck surface pattern including a central waffle pattern shown to produce superior central region temperature uniformity due to constant nominal contact area fraction, the performance of chuck surface patterns can be readily optimized for a particular heat flux and wafer temperature by simulating surface patterns having different widths of the outer contact region or annulus in accordance with the above discussion of effective ESC radius. Such a simulation and optimization process for the heat flux appropriate to an ECR-CVD process results in the preferred pattern shown in FIG. 10. This preferred pattern has a waffle-type pattern formed by a network of intersecting grooves having a width and spacing to produce a constant nominal contact area fraction in the range of 20% to 40% and an outer, annular region having a width of approximately 6 mm; the outer boundary of which is located at a radius which is approximately 0.1 cm less than the radius of a wafer to be held. The width of the outer, annular region is approximately 6.0 to 7.0 min.

The simulated temperature profile across the wafer obtained with the chuck surface pattern of FIG. 10 is shown in FIG. 9, in which the model was used to predict the wafer temperature uniformity with different widths of the outer contact region. It was found that the wafer temperature uniformity could be improved by increasing the inner diameter of the outer contact region, thus reducing the heat transport between the wafer and the ESC at the edge of the wafer. Further improvements were obtained by having the total radius of the ESC closer to that of the wafer, thus minimizing the "excess" heat which must be transferred to the ESC through the annular contact region.

Using an ESC with a reduced outer contact region and with a radius of 0.1 cm less than the wafer, the temperature uniformity across the wafer were substantially improved. FIG. 9 shows the measured wafer temperature profile obtained for an ESC having the waffle "contact" pattern and optimized to produce an average wafer temperature of 340° C. The wafer temperature is essentially flat over the inner 6 cm radius then gradually increases by only 30° C. at the edge of the wafer. The increase in the wafer temperature near the edge of the wafer is due primarily to the 0.1 cm overhang of the wafer, which represents 2% of the area of the wafer.

It should also be recognized from the foregoing description of the invention that a constant energy flux from the plasma to the wafer has been assumed and substantially constant wafer surface temperatures are obtained using a groove pattern and surface roughness which yields a substantially constant effective contact area fraction. The same principle of the invention can be extended to the case of non-uniform and/or asymmetrical plasma densities across the surface of the wafer. In such a case, the surface roughness and/or nominal contact area fraction may be adjusted to match the expected plasma density profile at various locations on the wafer. This will, of course, also allow differential adjustment of effective contact area fraction with clamping voltage in much the same fashion as differences in surface roughness between or across the width of the outer annular portion of the contact surface as compared to the central region of the groove pattern, as discussed above.

In conclusion, in order to minimize temperature sensitivity to the chuck and wafer surfaces, it has been found to be desirable to have backside helium as the heat transfer mechanism over a majority of the chuck surface area as it is not strongly dependent on surface morphology. Decreasing the influence of $X_c h_c$ by decreasing the contact pad area fraction and/or increasing the chuck surface roughness shifts the emphasis to the backside gas heat transfer mechanism. This approach to minimizing surface sensitivity raises two considerations: First, the contact pad area fraction can not be reduced beyond the point at which the total net chucking force (e.g. the electrostatic attraction force less the force due to the gas pressure on grooved areas) is incapable of holding the wafer; Second, in high power density applications, backside helium alone may not be capable of removing enough energy from the wafer for a given contact area fraction, thus establishing a lower limit to the nominal contact area fraction.

In view of the foregoing, it is seen that the chuck surface pattern in accordance with the invention provides substantially improved temperature uniformity across the surface of a wafer held by an electrostatic chuck during semiconductor processing operations. Further, quantification and characterization of the wafer-ESC interface allows the nominal wafer surface temperature range to be determined by the surface roughness of the contact portions of the chuck and reducing the contact area fraction as much as possible consistent with the heat flux which must be conducted across the interface. A coarse adjustment of wafer surface temperature may then be accomplished by variation of the electrostatic voltage used to hold the wafer against the chuck and fine temperature adjustment can be made by variation of the static pressure of gas contained in grooves in the chuck surface.

While the invention has been described in terms of a single preferred embodiment, those skilled in the art will recognize that the invention can be practiced with modification within the spirit and scope of the appended claims. For example, if the surface of the wafer can be adequately observed during wafer processing and temperature-dependent irregularities are detected, it would be possible to adjust the temperature profile in real time using the mathematical model described above to alter the temperature profile across the wafer in a correcting or compensating fashion.

Having thus described our invention, what we claim as new and desire to secure by Letters Patent are as follows:

1. An electrostatic chuck for holding a semiconductor wafer during processing thereof comprising a dielectric layer on a front face of said electrostatic chuck for contacting said wafer, said dielectric layer having a nominal surface roughness and a pattern of grooves formed therein to a depth which is short relative to the mean free path of a gas disposed therein at a static pressure, said pattern of grooves having a central portion over which said pattern of grooves defines a substantially constant nominal contact area fraction and an outer, annular contact region having another nominal contact area fraction, said another nominal contact area fraction being greater than said constant nominal contact area fraction, a cooling plate in thermal communication with said dielectric layer for removing heat from said electrostatic chuck, an electrode for developing an electrostatic attraction force of said wafer against said front face of said electrostatic chuck, said electrostatic chuck having a diameter less than the diameter of said wafer such that said wafer has an overhang region at an outer edge thereof which is reduced in temperature by said outer, annular contact region of said dielectric layer, and said outer, annular contact region having a width determined in accordance with a distance by which a wafer radius exceeds a radius of said electrostatic chuck to control wafer temperature uniformity.

2. An electrostatic chuck as recited in claim 1, wherein said width of said outer, annular contact region is approximately 2.0 to 2.5 times said distance by which a wafer radius exceeds an effective radius of said electrostatic chuck.

3. An electrostatic chuck as recited in claim 1, wherein a heat transfer coefficient of said outer, annular region has a width and effective contact area fraction which balances excess energy impinging of an outer edge region of said wafer.

4. An electrostatic chuck as recited in claim 3, wherein said width of said outer, annular contact region is approximately 2.0 to 2.5 times said distance by which a wafer radius exceeds an effective radius of said electrostatic chuck.

5. An electrostatic chuck as recited in claim 1, wherein a nominal value of said constant nominal contact area fraction is in the range of 20% to 40%.

6. An electrostatic chuck as recited in claim 1, wherein said surface roughness approximates the surface roughness of an unpolished surface of said semiconductor wafer.

7. An electrostatic chuck as recited in claim 1, wherein said surface roughness is approximately 0.2 to 0.5 microns.

8. An electrostatic chuck as recited in claim 1, wherein a periodicity of grooves in said pattern of grooves is less than ten times a thickness of said semiconductor wafer.

9. An electrostatic chuck as recited in claim 1, wherein a width of grooves in said pattern of grooves is less than 0.3 cm.

10. An electrostatic chuck as recited in claim 1, wherein said pattern of grooves defines a pattern of rectangular contact areas.

11. An electrostatic chuck as recited in claim 1, wherein a surface roughness of said outer, annular contact region is less than a surface roughness of contact areas of said central portion defined by said set of gas distribution grooves.

12. An electrostatic chuck system for holding a wafer-like workpiece by electrostatic attraction and comprising a dielectric layer supporting said workpiece and having a surface in mechanical contact with said workpiece, said surface having a set of gas distribution grooves therein with a nominal groove depth which is small in comparison with a mean free path of a molecule of gas contained therein and an annular rim at an outer periphery thereof;

gas supply means, connected to said set of gas distribution grooves, for maintaining a gas pressure in said gas distribution grooves;

an electrode, disposed below said dielectric layer and connected to voltage supply means for applying a voltage to said electrode and said workpiece, wherein said set of gas distribution grooves forms a set of contact pads having a common contact surface within said annular rim;

said gas pressure is such that a gas has a mean tree path large compared with said nominal groove depth; and said dielectric layer having a surface roughness determined in accordance with an intended wafer temperature during processing of said wafer.

13. An electrostatic chuck system as recited in claim 12, wherein the surface roughness of said top surface of said electrostatic chuck system is 0.2–0.5 microns.

14. An electrostatic chuck system as recited in claim 12, wherein the depth of said set of gas distribution grooves is in the range of 10–20 μm.

15. An electrostatic chuck system as recited in claim 12, wherein a contact area fraction of said dielectric later is approximately constant.

16. An electrostatic chuck system as recited in claim 12, wherein the width of said set of contact pads is 0.3 cm.

17. An electrostatic chuck system as recited in claim 12, wherein a surface roughness of said annular rim is less than a surface roughness of contact areas of said contact pads defined by said set of gas distribution grooves.

18. A method of processing a semiconductor wafer comprising the steps of:

attaching a semiconductor wafer to an electrostatic chuck having a first nominal contact area fraction in a first area between gas confining grooves on a surface thereof, and a second nominal contact area fraction in an outer annular contact region, each of said first area and said outer annular contact region having a nominal surface roughness, said second nominal contact area fraction being higher than said first nominal contact area fraction and said first and second nominal contact area fraction being determined in accordance with a desired nominal temperature of said semiconductor wafer, making an adjustment of temperature of said semiconductor wafer by adjustment of an electrostatic clamping voltage, and making an adjustment of temperature of said semiconductor wafer by adjustment of a gas pressure in said grooves.

19. A method as recited in claim 18, including the further step of adjusting a temperature profile along a radius of said semiconductor wafer by adjustment of at least one of clamping voltage and gas pressure.

20. A method as recited in claim 19, including the further step of transferring an energy impinging on a region of said wafer overhanging a face of said electrostatic chuck by heat transfer to said outer, annular contact region of of said face of said electrostatic chuck by selecting a corresponding second nominal contact area fraction.

21. An electrostatic chuck for holding a semiconductor wafer during processing thereof, comprising a dielectric layer on a front face of said electrostatic chuck for contacting said wafer, said dielectric layer having a surface roughness and a pattern of grooves formed therein to a depth which is short relative to the mean free path of a gas disposed therein at a static pressure, said pattern of grooves having a central portion over which said pattern of grooves defines a first nominal contact area fraction and an outer, annular region having a second nominal contact area fraction, said second nominal contact area fraction being greater than said first nominal contact area fraction, wherein an effective contact area fraction due to said surface roughness and said first nominal contact area fraction is determined in accordance with a plasma density profile across a surface of said semiconductor wafer, a cooling plate in thermal communication with said dielectric layer for removing heat from said electrostatic chuck, and an electrode for developing an electrostatic attraction force of said wafer against said front face of said electrostatic chuck.

* * * * *